US012676491B2

(12) United States Patent
Seo et al.

(10) Patent No.: US 12,676,491 B2
(45) Date of Patent: Jul. 7, 2026

(54) METHOD OF CONTROLLING A CHARGING VOLTAGE FOR EXTENDING THE LIFETIME OF A SECONDARY POWER SOURCE AND A STORAGE DEVICE PERFORMING THE SAME

(71) Applicant: SAMSUNG ELECTRONICS CO., LTD., Suwon-si (KR)

(72) Inventors: Hyundeok Seo, Hwaseong-si (KR); Jongwoo Jang, Seoul (KR); Jaewoong Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 849 days.

(21) Appl. No.: 17/831,523

(22) Filed: Jun. 3, 2022

(65) Prior Publication Data

US 2022/0407345 A1 Dec. 22, 2022

(30) Foreign Application Priority Data

Jun. 17, 2021 (KR) ........................ 10-2021-0078595

(51) Int. Cl.
*H02J 7/34* (2006.01)
*G11C 5/14* (2006.01)
(Continued)

(52) U.S. Cl.
CPC ............... *H02J 7/345* (2013.01); *H02J 7/52* (2026.01); *H02J 7/84* (2026.01); *H02J 7/971* (2026.01); *G11C 5/147* (2013.01); *H02J 2207/50* (2020.01)

(58) Field of Classification Search
CPC ......... G11C 5/147; H02J 7/345; H02J 7/0014; H02J 7/005; H02J 7/007188;
(Continued)

(56) References Cited

U.S. PATENT DOCUMENTS 4,039,940 A * 8/1977 Butler ................ G01R 27/2605
324/678
4,274,132 A * 6/1981 Molyneux-Berry ........................
H02M 3/33569
363/21.13
(Continued)

FOREIGN PATENT DOCUMENTS

CN 102171763 A 8/2011
KR 10-2011-0015273 2/2011
(Continued)

OTHER PUBLICATIONS

European search report dated Sep. 16, 2022 issued in corresponding European Patent Application No. 22165453.6.
(Continued)

*Primary Examiner* — Drew A Dunn
*Assistant Examiner* — Frank Alexis Silva
(74) *Attorney, Agent, or Firm* — Morgan, Lewis & Bockius LLP

(57) ABSTRACT

A method of controlling a charging voltage, the method including: receiving first environmental information from an environmental sensor, setting a voltage level of the charging voltage to a first voltage level in response to the first environmental information; charging a secondary power source including at least one capacitor with the charging voltage having the first voltage level; receiving second environmental information from the environmental sensor; in response to the second environmental information being different than the first environmental information, changing the voltage level of the charging voltage; and charging the secondary power source with the charging voltage having the changed voltage level.

17 Claims, 20 Drawing Sheets

(51) Int. Cl.

| | | |
|---|---|---|
| *H02J 7/52* | (2026.01) | |
| *H02J 7/84* | (2026.01) | |
| *H02J 7/90* | (2026.01) | |

(58) Field of Classification Search
CPC ............. H02J 2207/50; H02J 7/007182; H02J 7/0071; H02J 7/00712; H02J 7/007192
USPC ......................................................... 320/166
See application file for complete search history.

(56) References Cited

U.S. PATENT DOCUMENTS

| | | | | |
|---|---|---|---|---|
| 4,845,419 A * | 7/1989 | Hacker | ...................... | H02J 7/00 |
| | | | | 320/136 |
| 5,251,179 A * | 10/1993 | Wittman | ................. | H02J 9/061 |
| | | | | 307/66 |
| 5,661,349 A * | 8/1997 | Luck | ...................... | A01G 25/16 |
| | | | | 307/130 |
| 5,742,148 A * | 4/1998 | Sudo | .................... | H02J 7/1438 |
| | | | | 320/155 |
| 5,745,532 A * | 4/1998 | Campana, Jr. | .......... | H04L 7/042 |
| | | | | 455/504 |
| 5,748,104 A * | 5/1998 | Argyroudis | ........... | G08C 17/02 |
| | | | | 370/320 |
| 5,869,970 A * | 2/1999 | Palm | ...................... | A61N 1/378 |
| | | | | 607/28 |
| 5,883,886 A * | 3/1999 | Eaton | ................. | H04B 7/18567 |
| | | | | 340/870.14 |
| 5,969,436 A * | 10/1999 | Chalasani | ................. | H02J 9/06 |
| | | | | 307/64 |
| 5,994,878 A * | 11/1999 | Ostergaard | ........... | H02J 7/0071 |
| | | | | 320/132 |
| 6,140,928 A * | 10/2000 | Shibuya | ................ | H01M 10/48 |
| | | | | 324/426 |
| 6,181,108 B1 * | 1/2001 | Sudo | ...................... | H02J 7/0063 |
| | | | | 320/136 |
| 6,208,266 B1 * | 3/2001 | Lyons | .................... | G01D 4/004 |
| | | | | 348/160 |
| 6,246,677 B1 * | 6/2001 | Nap | .................. | H02J 13/00001 |
| | | | | 379/106.03 |
| 6,272,190 B1 * | 8/2001 | Campana, Jr. | ........... | H04B 7/10 |
| | | | | 375/347 |
| 6,343,051 B1 * | 1/2002 | Yabe | ...................... | G04G 19/00 |
| | | | | 368/64 |
| 6,370,046 B1 * | 4/2002 | Nebrigic | ................ | H02M 3/07 |
| | | | | 363/59 |
| 6,388,628 B1 * | 5/2002 | Dettloff | .............. | G06K 7/10346 |
| | | | | 343/742 |
| 6,396,772 B1 * | 5/2002 | Yabe | ...................... | G04G 19/04 |
| | | | | 368/204 |
| 6,426,628 B1 * | 7/2002 | Palm | .................... | A61N 1/3708 |
| | | | | 324/427 |
| 6,437,692 B1 * | 8/2002 | Petite | ................ | G05B 19/4185 |
| | | | | 702/56 |
| 6,459,175 B1 * | 10/2002 | Potega | .................... | B60L 53/11 |
| | | | | 307/132 M |
| 6,476,583 B2 * | 11/2002 | McAndrews | ......... | H02J 7/0013 |
| | | | | 320/128 |
| 6,480,699 B1 * | 11/2002 | Lovoi | ................ | G06K 19/0723 |
| | | | | 455/41.2 |
| 6,538,577 B1 * | 3/2003 | Ehrke | ...................... | H04Q 9/00 |
| | | | | 340/637 |
| 6,628,572 B1 * | 9/2003 | Yabe | .................... | H02J 7/0032 |
| | | | | 368/204 |
| 6,819,226 B2 * | 11/2004 | Randall | .................. | H02J 9/061 |
| | | | | 455/127.5 |
| 7,183,748 B1 * | 2/2007 | Unno | ...................... | H02J 7/04 |
| | | | | 320/136 |
| 7,692,411 B2 * | 4/2010 | Trainor | ................ | H02J 7/0024 |
| | | | | 320/167 |
| 7,982,439 B2 * | 7/2011 | Trainor | .................. | H02J 7/35 |
| | | | | 363/59 |

| | | | | |
|---|---|---|---|---|
| 8,315,829 B2 | 11/2012 | Zhang | | |
| 8,400,026 B2 | 3/2013 | Park et al. | | |
| 8,400,116 B2 * | 3/2013 | Kim | ................... | G01R 31/3835 |
| | | | | 320/133 |
| 9,013,944 B2 * | 4/2015 | Jeon | ...................... | G11C 29/021 |
| | | | | 365/229 |
| 9,252,603 B2 * | 2/2016 | Shim | ........................ | H02J 7/54 |
| 9,508,399 B1 * | 11/2016 | Bottemiller | ........... | G11C 5/148 |
| 9,627,904 B2 * | 4/2017 | Wang | ........................ | H02J 7/00 |
| 10,094,887 B2 * | 10/2018 | Lee | ......................... | G01R 31/40 |
| 10,283,820 B2 * | 5/2019 | Sugeno | ................ | H02J 7/0029 |
| 10,326,298 B2 * | 6/2019 | Lee | ......................... | H02J 50/12 |
| 10,333,319 B2 * | 6/2019 | Sepe, Jr. | .............. | H02J 7/0014 |
| 10,424,954 B2 * | 9/2019 | Zhang | ...................... | H04B 3/54 |
| 10,461,568 B2 * | 10/2019 | Zhang | ................. | H01M 10/425 |
| 10,596,909 B2 * | 3/2020 | Choi | ....................... | B60L 50/40 |
| 10,630,189 B1 * | 4/2020 | Ouyang | ........... | H02M 3/33538 |
| 10,658,854 B2 | 5/2020 | Zhang | | |
| 10,705,155 B2 | 7/2020 | An et al. | | |
| 10,782,762 B2 | 9/2020 | Ryu | | |
| 11,127,457 B2 * | 9/2021 | Kim | ................... | G11C 13/0026 |
| 11,133,920 B2 * | 9/2021 | Lim | ......................... | H04L 7/0033 |
| 11,164,435 B1 * | 11/2021 | Skeoch | ............... | G08B 15/001 |
| 11,362,542 B2 * | 6/2022 | Park | ........................ | G06F 1/189 |
| 11,411,422 B2 * | 8/2022 | Fan | ......................... | H02J 7/0029 |
| 11,563,339 B2 * | 1/2023 | Levkov | .................... | A61N 1/08 |
| 11,632,228 B2 * | 4/2023 | Lim | ......................... | H03L 7/099 |
| | | | | 375/355 |
| 11,662,391 B1 * | 5/2023 | Nachman | ................ | H02J 7/005 |
| | | | | 320/132 |
| 11,764,718 B2 * | 9/2023 | Engst | .................. | H02J 7/00714 |
| | | | | 318/139 |
| 11,843,096 B2 * | 12/2023 | Sugisawa | ........... | H01M 10/425 |
| 11,854,648 B2 * | 12/2023 | Ryu | ........................ | G11C 16/30 |
| 11,869,602 B2 * | 1/2024 | Ryu | .................. | H02J 7/007182 |
| 12,451,714 B2 * | 10/2025 | Takahashi | ............... | H02J 7/933 |
| 12,512,524 B2 * | 12/2025 | Takahashi | ............. | H01M 10/48 |
| 2001/0002772 A1 * | 6/2001 | Kim | ........................ | H02J 7/345 |
| | | | | 307/64 |
| 2001/0020653 A1 * | 9/2001 | Wilson | .................. | B05B 5/1691 |
| | | | | 239/708 |
| 2001/0043050 A1 * | 11/2001 | Fisher, Jr. | ................. | H02J 7/35 |
| | | | | 320/101 |
| 2002/0000788 A1 * | 1/2002 | Ostergaard | ........... | H02J 7/0031 |
| | | | | 320/128 |
| 2002/0082748 A1 * | 6/2002 | Enga | ...................... | G01D 4/004 |
| | | | | 700/286 |
| 2002/0161536 A1 * | 10/2002 | Suh | ........................ | G01D 4/004 |
| | | | | 702/62 |
| 2003/0210450 A1 * | 11/2003 | Yu | ........................... | G02F 1/163 |
| | | | | 351/44 |
| 2003/0222505 A1 | 12/2003 | Otani et al. | | |
| 2005/0252546 A1 * | 11/2005 | Sasaki | .................... | H02S 40/38 |
| | | | | 136/243 |
| 2006/0279970 A1 * | 12/2006 | Kernahan | ........... | H02M 3/1588 |
| | | | | 363/65 |
| 2007/0033431 A1 * | 2/2007 | Pecone | .............. | G06F 11/1441 |
| | | | | 714/6.12 |
| 2007/0033432 A1 * | 2/2007 | Pecone | .................. | G06F 1/305 |
| | | | | 714/6.12 |
| 2007/0182362 A1 * | 8/2007 | Trainor | ............... | H01M 16/003 |
| | | | | 320/101 |
| 2007/0194759 A1 * | 8/2007 | Shimizu | .................. | H02J 7/345 |
| | | | | 320/166 |
| 2007/0212596 A1 * | 9/2007 | Nebrigic | .............. | H01M 10/42 |
| | | | | 429/61 |
| 2008/0048621 A1 * | 2/2008 | Yun | ...................... | H01M 10/482 |
| | | | | 320/136 |
| 2008/0185998 A1 * | 8/2008 | Starodubtsev | ......... | H01G 11/08 |
| | | | | 320/166 |
| 2008/0235471 A1 * | 9/2008 | Feldman | ............ | G06F 11/1456 |
| | | | | 711/162 |
| 2009/0088993 A1 * | 4/2009 | Oohasi | .................. | B60L 3/0092 |
| | | | | 702/63 |
| 2009/0140575 A1 * | 6/2009 | McGee | ................... | H02J 7/345 |
| | | | | 320/167 |

(56) References Cited

U.S. PATENT DOCUMENTS

| | | | | |
|---|---|---|---|---|
| 2009/0267565 | A1* | 10/2009 | Studyvin | H02J 7/54 |
| | | | | 320/116 |
| 2009/0309423 | A1* | 12/2009 | Utsumi | H02J 7/04 |
| | | | | 307/66 |
| 2010/0008174 | A1* | 1/2010 | Sartore | G11C 16/10 |
| | | | | 365/228 |
| 2010/0060231 | A1* | 3/2010 | Trainor | H01G 11/14 |
| | | | | 320/103 |
| 2010/0142307 | A1 | 6/2010 | Satore | |
| 2010/0315046 | A1* | 12/2010 | Trainor | H02J 7/35 |
| | | | | 320/167 |
| 2010/0329065 | A1* | 12/2010 | Johnston | G05F 1/46 |
| | | | | 365/229 |
| 2010/0332858 | A1* | 12/2010 | Trantham | G06F 1/263 |
| | | | | 713/300 |
| 2010/0332862 | A1* | 12/2010 | Lester | G11C 29/02 |
| | | | | 365/201 |
| 2010/0332896 | A1* | 12/2010 | Wilson | G06F 1/30 |
| | | | | 714/E11.054 |
| 2011/0031811 | A1* | 2/2011 | Park | H02J 7/345 |
| | | | | 307/66 |
| 2011/0064445 | A1* | 3/2011 | Yashiro | G03G 15/5004 |
| | | | | 399/88 |
| 2011/0089997 | A1* | 4/2011 | Tonomura | H02M 3/07 |
| | | | | 327/536 |
| 2011/0115427 | A1* | 5/2011 | Morita | H02J 7/34 |
| | | | | 320/149 |
| 2011/0148345 | A1* | 6/2011 | Bockermann | H02J 7/345 |
| | | | | 320/103 |
| 2011/0215770 | A1* | 9/2011 | Belz | H02J 7/0068 |
| | | | | 320/160 |
| 2011/0227540 | A1* | 9/2011 | Kanoh | B60L 58/24 |
| | | | | 320/135 |
| 2011/0241624 | A1* | 10/2011 | Park | H03K 17/145 |
| | | | | 327/427 |
| 2012/0062187 | A1* | 3/2012 | Shim | H02H 3/10 |
| | | | | 320/167 |
| 2012/0068669 | A1* | 3/2012 | Trainor | H01M 16/003 |
| | | | | 320/167 |
| 2012/0093537 | A1* | 4/2012 | Eguchi | G03G 15/0283 |
| | | | | 399/88 |
| 2012/0117409 | A1* | 5/2012 | Lee | G06F 1/30 |
| | | | | 713/340 |
| 2012/0223670 | A1* | 9/2012 | Kinjo | H02J 7/35 |
| | | | | 320/135 |
| 2012/0248870 | A1* | 10/2012 | Coleman | H02J 7/35 |
| | | | | 320/101 |
| 2012/0326514 | A1* | 12/2012 | Kim | H02J 9/005 |
| | | | | 307/66 |
| 2013/0015701 | A1* | 1/2013 | Lee | H02J 7/1446 |
| | | | | 307/9.1 |
| 2013/0033110 | A1* | 2/2013 | Sun | H02M 1/36 |
| | | | | 307/64 |
| 2013/0038297 | A1* | 2/2013 | Sang | H02J 7/0071 |
| | | | | 320/145 |
| 2013/0094883 | A1* | 4/2013 | Sasaki | H02J 7/0048 |
| | | | | 399/168 |
| 2013/0119923 | A1 | 5/2013 | Wright et al. | |
| 2013/0170312 | A1* | 7/2013 | Tiyyagura | G01R 31/40 |
| | | | | 365/229 |
| 2013/0176037 | A1* | 7/2013 | Waki | H04Q 9/00 |
| | | | | 324/658 |
| 2013/0229880 | A1* | 9/2013 | Sartore | G11C 5/141 |
| | | | | 365/189.07 |
| 2013/0257354 | A1* | 10/2013 | Koyama | H02J 7/007 |
| | | | | 320/107 |
| 2013/0283069 | A1* | 10/2013 | Matsuda | G06F 1/263 |
| | | | | 713/300 |
| 2014/0002029 | A1* | 1/2014 | Sameshima | H02J 7/0049 |
| | | | | 320/134 |
| 2014/0006834 | A1* | 1/2014 | Ishii | G06F 12/0802 |
| | | | | 713/340 |
| 2014/0062396 | A1* | 3/2014 | Reddy | B60L 53/22 |
| | | | | 320/109 |
| 2014/0101476 | A1* | 4/2014 | Lu | H04L 12/2807 |
| | | | | 713/340 |
| 2014/0169115 | A1* | 6/2014 | Jeon | G11C 29/028 |
| | | | | 365/226 |
| 2014/0184165 | A1* | 7/2014 | Takahashi | H01M 10/48 |
| | | | | 429/90 |
| 2014/0265553 | A1* | 9/2014 | Mcgee | G05F 3/10 |
| | | | | 307/9.1 |
| 2014/0331071 | A1* | 11/2014 | Miller | G06F 1/263 |
| | | | | 713/340 |
| 2014/0375280 | A1* | 12/2014 | Jung | H02J 7/64 |
| | | | | 320/163 |
| 2015/0008867 | A1* | 1/2015 | Smychkovich | H02J 7/00 |
| | | | | 320/137 |
| 2015/0008872 | A1* | 1/2015 | Fujimori | H02J 50/001 |
| | | | | 320/107 |
| 2015/0016206 | A1* | 1/2015 | Hauck | G01R 31/64 |
| | | | | 307/66 |
| 2015/0026516 | A1* | 1/2015 | Yong | G06F 11/2015 |
| | | | | 714/14 |
| 2015/0035450 | A1* | 2/2015 | Werner | H05B 45/10 |
| | | | | 315/291 |
| 2015/0042277 | A1* | 2/2015 | Tang | B60L 50/52 |
| | | | | 320/109 |
| 2015/0048680 | A1* | 2/2015 | Miyamura | H02J 1/102 |
| | | | | 307/31 |
| 2015/0100824 | A1* | 4/2015 | Lucas | G06F 11/1402 |
| | | | | 714/22 |
| 2015/0127999 | A1* | 5/2015 | Delpapa | G06F 1/28 |
| | | | | 714/721 |
| 2015/0149806 | A1* | 5/2015 | Lucas | G06F 1/30 |
| | | | | 713/330 |
| 2015/0153799 | A1* | 6/2015 | Lucas | G06F 1/3275 |
| | | | | 713/300 |
| 2015/0256016 | A1* | 9/2015 | Wang | H01M 10/44 |
| | | | | 320/162 |
| 2015/0329009 | A1* | 11/2015 | Dente | B60L 58/25 |
| | | | | 307/10.1 |
| 2015/0340882 | A1* | 11/2015 | Göth | H02J 7/00 |
| | | | | 320/167 |
| 2016/0049177 | A1* | 2/2016 | Shiozawa | G11C 5/141 |
| | | | | 365/226 |
| 2016/0071609 | A1* | 3/2016 | Lucas | G06F 11/1402 |
| | | | | 365/185.18 |
| 2016/0149417 | A1* | 5/2016 | Davis | H02J 7/0019 |
| | | | | 320/162 |
| 2016/0156276 | A1* | 6/2016 | Yuan | H02M 7/4837 |
| | | | | 363/35 |
| 2016/0231361 | A1* | 8/2016 | Shamir | G01R 21/06 |
| 2016/0246345 | A1* | 8/2016 | Johnston | G06F 1/26 |
| 2016/0254689 | A1* | 9/2016 | Lee | H02M 3/158 |
| | | | | 320/107 |
| 2016/0268833 | A1* | 9/2016 | Lee | H02J 50/12 |
| 2016/0274637 | A1 | 9/2016 | Kang | |
| 2016/0322859 | A1* | 11/2016 | Yamamoto | H02J 7/342 |
| 2016/0345081 | A1* | 11/2016 | Yamada | H04Q 9/00 |
| 2016/0380441 | A1* | 12/2016 | Groat | H02J 7/007 |
| | | | | 320/107 |
| 2017/0045563 | A1* | 2/2017 | Lee | G01R 27/2605 |
| 2017/0054306 | A1* | 2/2017 | Vo | H02J 7/0016 |
| 2017/0062056 | A1* | 3/2017 | Park | G11C 5/148 |
| 2017/0067968 | A1* | 3/2017 | Lee | G01R 31/40 |
| 2017/0069356 | A1* | 3/2017 | Schmidt | G11C 29/02 |
| 2017/0090538 | A1* | 3/2017 | Wang | G06F 1/30 |
| 2017/0140825 | A1* | 5/2017 | Park | G06F 3/0688 |
| 2017/0187199 | A1* | 6/2017 | Wei | H02J 7/00 |
| 2017/0201101 | A1* | 7/2017 | Yang | H02M 3/158 |
| 2017/0222450 | A1* | 8/2017 | Lee | H02J 7/00 |
| 2017/0222451 | A1 | 8/2017 | Peng | |
| 2017/0279275 | A1* | 9/2017 | Yamamoto | H02J 7/007182 |
| 2017/0279286 | A1* | 9/2017 | Zhang | H02J 7/0042 |
| 2017/0288425 | A1* | 10/2017 | Fukushima | H01M 10/0525 |
| 2017/0294691 | A1* | 10/2017 | Yamamoto | H02J 7/007182 |
| 2017/0352422 | A1* | 12/2017 | Pardoe | G11C 16/10 |

(56)          References Cited

U.S. PATENT DOCUMENTS

| | | | |
|---|---|---|---|
| 2018/0026472 A1* | 1/2018 | Zhang | H02M 3/33576 |
| | | | 320/145 |
| 2018/0042075 A1* | 2/2018 | Welten | H05B 45/3575 |
| 2018/0048148 A1* | 2/2018 | Ibrahim | H02J 1/10 |
| 2018/0069272 A1* | 3/2018 | Seo | B60L 3/0046 |
| 2018/0115024 A1* | 4/2018 | Sugeno | H02J 7/35 |
| 2018/0136712 A1* | 5/2018 | Niikura | H02J 7/0068 |
| 2018/0154779 A1* | 6/2018 | Chol | B60L 1/00 |
| 2018/0166892 A1* | 6/2018 | Sepe, Jr. | H02J 7/007194 |
| 2018/0181184 A1* | 6/2018 | Ye | H02J 9/04 |
| 2018/0270632 A1* | 9/2018 | Kaneeda | G08C 17/00 |
| 2018/0294666 A1* | 10/2018 | Tian | H02M 3/33523 |
| 2019/0041938 A1* | 2/2019 | Zupanc | G06F 1/30 |
| 2019/0094279 A1* | 3/2019 | Ou Yang | H02M 3/157 |
| 2019/0161043 A1* | 5/2019 | Schumacher | H02J 7/345 |
| 2019/0162797 A1* | 5/2019 | An | G01R 31/64 |
| 2019/0176650 A1* | 6/2019 | Wood | B60L 50/40 |
| 2019/0305574 A1* | 10/2019 | Matsumura | H02J 7/007194 |
| 2019/0305587 A1* | 10/2019 | Teng | H02J 7/00 |
| 2019/0339761 A1* | 11/2019 | Ryu | G11C 16/30 |
| 2019/0393716 A1* | 12/2019 | Tian | H02J 7/0071 |
| 2020/0025834 A1* | 1/2020 | Okamoto | G06F 1/30 |
| 2020/0042207 A1* | 2/2020 | Kwak | G06F 3/0625 |
| 2020/0064430 A1* | 2/2020 | Nam | H02J 7/345 |
| 2020/0077333 A1* | 3/2020 | Kito | G01D 5/00 |
| 2020/0083739 A1* | 3/2020 | Zhang | H02J 7/02 |
| 2020/0161961 A1* | 5/2020 | Sato | H02M 3/155 |
| 2020/0189414 A1* | 6/2020 | Morita | H02J 7/1423 |
| 2020/0203964 A1* | 6/2020 | Chen | H02J 7/0016 |
| 2020/0266661 A1* | 8/2020 | Park | G06F 1/189 |
| 2020/0358296 A1* | 11/2020 | Kim | H02J 7/0013 |
| 2020/0388307 A1* | 12/2020 | Rowley | H03K 17/687 |
| 2020/0409838 A1* | 12/2020 | Park | G11C 16/30 |
| 2020/0412139 A1* | 12/2020 | Tian | H02J 7/0068 |
| 2020/0412164 A1* | 12/2020 | Miller | H02J 7/00712 |
| 2021/0012842 A1 | 1/2021 | Ryu et al. | |
| 2021/0027837 A1* | 1/2021 | Kim | G11C 13/0061 |
| 2021/0067310 A1* | 3/2021 | Lim | H03L 7/102 |
| 2021/0074336 A1* | 3/2021 | Kumagai | G11C 14/0018 |
| 2021/0090673 A1* | 3/2021 | Jin | G11C 29/021 |
| 2021/0116529 A1* | 4/2021 | Nam | G01R 19/16538 |
| 2021/0123776 A1* | 4/2021 | Awatsu | G01R 31/40 |
| 2021/0126483 A1 | 4/2021 | Fan et al. | |
| 2021/0135473 A1* | 5/2021 | Wigney | H01M 10/48 |
| 2021/0135481 A1* | 5/2021 | Sugisawa | H01M 10/443 |
| 2021/0143765 A1* | 5/2021 | Engst | H02J 7/007194 |
| 2021/0175729 A1* | 6/2021 | Rea | H01M 10/425 |
| 2021/0194285 A1* | 6/2021 | Park | H02J 50/80 |
| 2021/0249893 A1* | 8/2021 | Levkov | A61N 1/08 |
| 2021/0270433 A1* | 9/2021 | Slowik | F21S 9/02 |
| 2021/0359533 A1* | 11/2021 | Hatano | H02M 3/158 |
| 2021/0376717 A1* | 12/2021 | Liu | H02M 3/01 |
| 2021/0408821 A1* | 12/2021 | Rodrigues Mansano | |
| | | | H02J 9/04 |
| 2022/0006604 A1* | 1/2022 | Lim | H04L 7/0033 |
| 2022/0060033 A1* | 2/2022 | Bang | H02J 7/0048 |
| 2022/0084604 A1* | 3/2022 | Yamasaki | G11C 16/0483 |
| 2022/0093173 A1* | 3/2022 | Kamada | G11C 16/22 |
| 2022/0153149 A1* | 5/2022 | Kusch | B60L 58/20 |
| 2022/0155384 A1* | 5/2022 | Lovati | G01R 27/2605 |
| 2022/0158474 A1* | 5/2022 | Kitazaki | H02J 7/34 |
| 2022/0166249 A1* | 5/2022 | Shindo | B60R 16/033 |
| 2022/0197520 A1* | 6/2022 | Kobayashi | H02M 1/007 |
| 2022/0199122 A1* | 6/2022 | Lee | G11C 5/141 |
| 2022/0285974 A1* | 9/2022 | Kim | H02J 7/007 |
| 2022/0300171 A1* | 9/2022 | Linnen | G06F 1/266 |
| 2022/0320892 A1* | 10/2022 | Sahasrabudhe | G06F 1/30 |
| 2022/0336024 A1* | 10/2022 | Tanamura | G06F 1/26 |
| 2022/0337075 A1* | 10/2022 | Chen | H02J 7/855 |
| 2022/0351792 A1* | 11/2022 | D'Souza | G11C 17/16 |
| 2022/0407345 A1* | 12/2022 | Seo | H02J 7/345 |
| 2023/0047440 A1* | 2/2023 | Wigney | H02J 7/0048 |
| 2023/0170713 A1* | 6/2023 | Kai | H02J 7/345 |
| | | | 307/64 |
| 2023/0198035 A1* | 6/2023 | Takahashi | H02J 7/0047 |
| | | | 702/63 |
| 2023/0238891 A1* | 7/2023 | Tian | H02M 3/33576 |
| | | | 320/107 |
| 2023/0246801 A1* | 8/2023 | Lim | H03L 7/102 |
| | | | 375/355 |
| 2023/0249635 A1* | 8/2023 | Tsuchiya | H02J 7/00 |
| | | | 320/150 |
| 2023/0318469 A1* | 10/2023 | Bieber | H03K 17/133 |
| | | | 363/21.04 |
| 2023/0359231 A1* | 11/2023 | Rastegar | H02J 7/0069 |
| 2023/0417577 A1* | 12/2023 | Kamimurai | G11C 5/144 |
| 2024/0030722 A1* | 1/2024 | Yamanaka | H02J 7/345 |
| 2024/0096427 A1* | 3/2024 | Ryu | G11C 16/30 |
| 2024/0210002 A1* | 6/2024 | Slowik | F21S 9/02 |
| 2024/0353503 A1* | 10/2024 | Brophy | G01R 27/2605 |
| 2024/0419236 A1* | 12/2024 | Kimura | G06F 3/0653 |
| 2025/0074251 A1* | 3/2025 | Jin | B60L 58/15 |

FOREIGN PATENT DOCUMENTS

| | | |
|---|---|---|
| KR | 10-2018-0100463 | 9/2018 |
| KR | 10-2019-0062032 | 6/2019 |
| KR | 10-2019-0127387 | 11/2019 |
| KR | 10-2021-0007456 | 1/2021 |
| KR | 10-2021-0049709 | 5/2021 |
| TW | 201939299 A | 10/2019 |

OTHER PUBLICATIONS

Office Action dated Feb. 13, 2026 issued in corresponding to Taiwanese Patent Application No. 111114683.

* cited by examiner

110a

110b

110c

VCG1                    VCG2

113        115          117        119

...                     ...

300

LUT1

| STATE | VOLTAGE LEVEL OF CHARGING VOLTAGE | ENVIRONMENTAL INFORMATION |
|---|---|---|
| S11 | V11 | ER11 |
| S21 | V21 | ER21 |
| S31 | V31 | ER31 |
| ⋮ | . | ⋮ |

LUT2

| STATE | VOLTAGE LEVEL OF CHARGING VOLTAGE | REFERENCE CAPACITANCE |
|---|---|---|
| S12 | V12 | C12 |
| S22 | V22 | C22 |
| S32 | V32 | C32 |
| ⋮ | ⋮ | · |

FIG. 16

LUT3

| STATE | VOLTAGE LEVEL OF CHARGING VOLTAGE | REFERENCE CAPACITANCE | ENVIRONMENTAL INFORMATION |
|---|---|---|---|
| S13 | V13 | C13 | ER13 |
| S23 | V23 | C23 | ER23 |
| S33 | V33 | C33 | ER33 |
| ... | ... | ... | .. |

METHOD OF CONTROLLING A CHARGING VOLTAGE FOR EXTENDING THE LIFETIME OF A SECONDARY POWER SOURCE AND A STORAGE DEVICE PERFORMING THE SAME

CROSS-REFERENCE TO RELATED APPLICATION

This application claims priority under 35 U.S.C. § 119 to Korean Patent Application No. 10-2021-0078595 filed on Jun. 17, 2021 in the Korean Intellectual Property Office (KIPO), the disclosure of which is incorporated by reference herein in its entirety.

1. Technical Field

Example embodiments of the present disclosure relate generally to semiconductor integrated circuits, and more particularly to methods of controlling charging voltages for extending the lifetime of secondary power sources, and a storage device performing the same.

2. Description of the Related Art

Certain types of data storage devices include one or more semiconductor memory devices. Examples of such data storage devices include solid state drives (SSDs). SSDs typically use flash memory. SSDs may have various design and/or performance advantages over hard disk drives (HDDs). Compared with HDDs, SSDs are typically more resistant to physical shock, run silently, and have quicker access time and lower latency. Other differences include the absence of moving mechanical parts, greater stability, and lower power consumption. Recently, various systems, e.g., a laptop computer, a car, an airplane, a drone, etc., have adopted the SSDs for data storage.

Storage devices including a storage controller, a volatile memory and nonvolatile memories typically operate by receiving externally-supplied power. During operation of a storage device, a sudden power-off (SPO) event where power is suddenly interrupted may occur. In other words, the storage device may inadvertently shut down. Since a storage controller stores data using a volatile memory, the data stored in the volatile memory may be lost when the SPO event occurs. Further, an ongoing operation in a nonvolatile memory (for example, an erase operation, a write operation, or the like) may not be completed when an SPO event occurs. Accordingly, a storage device may complete an ongoing operation using a secondary power source, and may perform a data backup operation.

SUMMARY

At least one example embodiment of the present disclosure provides a method of controlling a charging voltage supplied to a secondary power source to efficiently extend the lifetime of the secondary power source.

At least one example embodiment of the present disclosure provides a storage device that performs the method of controlling the charging voltage.

According to example embodiments of the present disclosure, a method of controlling a charging voltage includes: receiving first environmental information from an environmental sensor; setting a voltage level of the charging voltage to a first voltage level in response to the first environmental information; charging a secondary power source including at least one capacitor with the charging voltage having the first voltage level; receiving second environmental information from the environmental sensor; in response to the second environmental information being different than the first environmental information, changing the voltage level of the charging voltage; and charging the secondary power source with the charging voltage having the changed voltage level.

According to example embodiments of the present disclosure, a method of controlling a charging voltage includes: determining a characteristic of at least one capacitor included in a secondary power source; in response to the at least one capacitor having a first characteristic, charging the secondary power source with the charging voltage generated by performing a first control scheme in which a voltage level of the charging voltage is adjusted based on a present capacitance of the secondary power source; and in response to the at least one capacitor having a second characteristic, charging the secondary power source with the charging voltage generated by performing a second control scheme in which the voltage level of the charging voltage is adjusted based on the present capacitance of the secondary power source and environmental information received from an environmental sensor.

According to example embodiments of the present disclosure, a method of controlling a charging voltage that is used to charge a secondary power source including at least one capacitor includes: determining whether the at least one capacitor has a first characteristic or a second characteristic different from the first characteristic; in response to the at least one capacitor having the first characteristic, charging the secondary power source by performing a first control scheme in which a voltage level of the charging voltage is adjusted based on a present capacitance of the secondary power source; and in response to the at least one capacitor having the second characteristic, charging the secondary power source by performing a second control scheme in which the voltage level of the charging voltage is adjusted based on the present capacitance of the secondary power source and environmental information received from an environmental sensor, wherein the first characteristic represents that a remaining lifetime of the at least one capacitor decreases rapidly as the voltage level of the charging voltage increases, wherein the second characteristic represents that the remaining lifetime of the at least one capacitor decreases slowly as the voltage level of the charging voltage increases, or the remaining lifetime of the at least one capacitor is irrelevant to the voltage level of the charging voltage, wherein charging the secondary power source by performing the first control scheme includes: setting the voltage level of the charging voltage to a first voltage level; charging the secondary power source based on the charging voltage having the first voltage level; obtaining the present capacitance of the secondary power source; in response to the present capacitance of the secondary power source being less than a first reference capacitance, changing the voltage level of the charging voltage to a second voltage level higher than the first voltage level; and charging the secondary power source based on the charging voltage having the second voltage level, and wherein charging the secondary power source by performing the second control scheme includes: receiving initial environmental information from the environmental sensor; setting the voltage level of the charging voltage to a third voltage level based on the initial environmental information; charging the secondary power source based on the charging voltage having the third voltage level; storing the initial environmental information as previous environmental information; receiving present environmental information from the environmental sensor; in response to the present environmental information being different than the previous environmental information, changing the voltage level of the charging voltage to a fourth voltage level different from the third voltage level; charging the secondary power source based on the charging voltage having the third voltage level or the fourth voltage level; and storing the present environmental information as new previous environmental information.

According to example embodiments of the present disclosure, a storage device includes: a secondary power source including at least one capacitor, wherein the secondary power source is configured to be charged based on a charging voltage, and is configured to generate an internal power supply voltage; a charging circuit configured to generate the charging voltage based on an external power supply voltage and a charging voltage control signal; a monitoring circuit configured to monitor a present capacitance of the secondary power source; an environmental sensor configured to generate initial environmental information and present environmental information; a voltage controller configured to generate the charging voltage control signal based on the present capacitance, the initial environmental information and the present environmental information; and a main system configured to operate based on the external power supply voltage or the internal power supply voltage, wherein the charging circuit and the voltage controller are configured to set a voltage level of the charging voltage to a first voltage level based on the initial environmental information, and the secondary power source is configured to be charged based on the charging voltage having the first voltage level, and wherein, in response to the present environmental information being different than previous environmental information, the charging circuit and the voltage controller are configured to change the voltage level of the charging voltage, and the secondary power source is configured to be charged based on the charging voltage in which the voltage level is changed.

In the method of controlling the charging voltage and the storage device according to example embodiments of the present disclosure, the voltage level of the charging voltage may be set and changed adaptively and/or in real time based on the environmental information received from the environmental sensor such that the charging voltage is appropriate or suitable for a corresponding environment and there is no lack of energy. In addition, the voltage level of the charging voltage may be set and changed adaptively and/or in real time depending on the characteristic of the at least one capacitor included in the secondary power source. Accordingly, the at least one capacitor included in the secondary power source may be efficiently derated, the lifetime of the at least one capacitor may be increased, and thus the lifetime and reliability of the secondary power source may be increased.

BRIEF DESCRIPTION OF THE DRAWINGS

The above and other features of the present disclosure will be more clearly understood by describing in detail example embodiments thereof with reference to the accompanying drawings.

FIG. 16 is a diagram for describing an operation of FIG. 15.

FIGS. 18A, 188, 19A and 19B are diagrams for describing configurations and operations of an electronic device that performs a method of controlling a charging voltage according to example embodiments of the present disclosure.

DETAILED DESCRIPTION OF THE EMBODIMENTS

Figure 1:
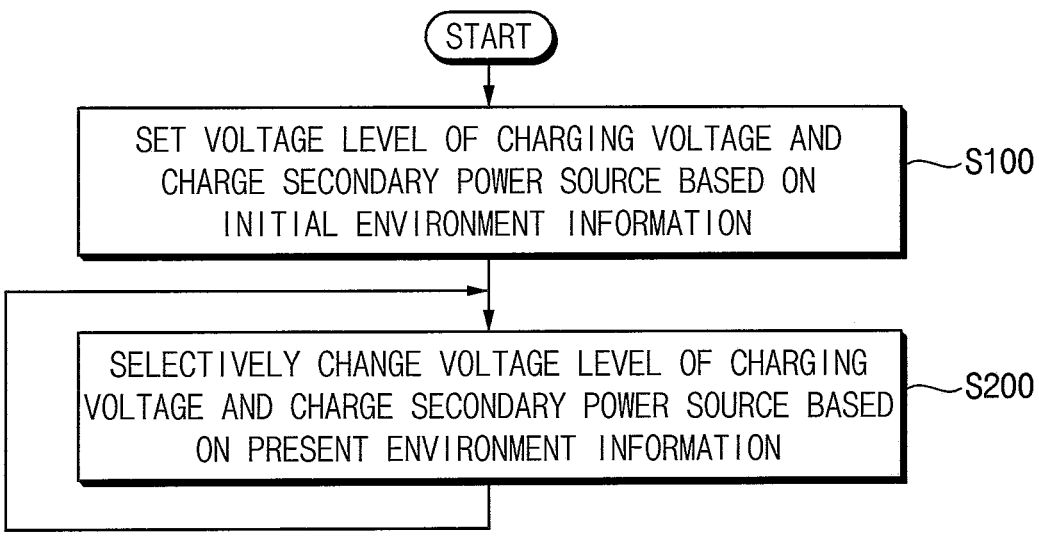
FIG. 1 is a flowchart illustrating a method of controlling a charging voltage according to example embodiments of the present disclosure.

Various example embodiments of the present disclosure will be described more fully hereinafter with reference to the accompanying drawings. The present disclosure may, however, be embodied in many different forms and should not be construed as limited to the embodiments set forth herein. Like reference numerals may refer to like elements throughout this application.

FIG. 1 is a flowchart illustrating a method of controlling a charging voltage according to example embodiments of the present disclosure.

Referring to FIG. 1, a method of controlling a charging voltage according to example embodiments of the present disclosure is performed to adjust a voltage level of the charging voltage, which is used to charge a secondary power source (or an auxiliary power device), to extend or prolong the lifetime of the secondary power source. The secondary power source includes at least one capacitor. The secondary power source may be included in an electronic device (or an electronic system) such as a storage device, and may generate an internal power supply voltage for driving the electronic device when the external power supply voltage for driving the electronic device is blocked or cut off. Detailed configurations of the secondary power source and the electronic device (e.g., the storage device) including the secondary power source will be described with reference to FIGS. 2 through 6.

In the method of controlling the charging voltage of FIG. 1, the voltage level of the charging voltage is set, adjusted and/or changed based on environmental information received from an environmental sensor. For example, the environmental sensor may include a temperature sensor or a humidity sensor, and the environmental information may include temperature or humidity. However, example embodiments of the present disclosure are not limited thereto.

For example, based on initial environmental information received from the environmental sensor, the voltage level of the charging voltage is set and the secondary power source is charged using the charging voltage (step S100). For example, the initial environmental information may represent environmental information that is obtained at an initial operation time of the secondary power source and the electronic device (e.g., the storage device) including the secondary power source. As an example, the initial environmental information may be obtained immediately after the electronic device and/or the storage device is manufactured or when the electronic device and/or the storage device is powered on. As another example, the voltage level of the charging voltage may be set to a first voltage level. The first voltage level may be referred to as an initial voltage level. Step S100 will be described in further detail with reference to FIG. 7.

After the voltage level of the charging voltage is set, based on present (or current) environmental information received from the environmental sensor, the voltage level of the charging voltage is selectively changed and the secondary power source is charged using the charging voltage (step S200). The present environmental information may represent environmental information that is obtained in real time or online (or during runtime) while the secondary power source and the electronic device (e.g., the storage device) including the secondary power source are operating. For example, when environmental information is changed and a specific energy condition is satisfied (e.g., energy is sufficient to change the voltage level of the charging voltage), the voltage level of the charging voltage may be set to a second voltage level different from the first voltage level. Step S200 will be described in further detail with reference to FIGS. 7 through 10.

Step S200 may be repeatedly performed while the secondary power source and the electronic device (e.g., the storage device) including the secondary power source are operating. In some example embodiments of the present disclosure, step S200 may be periodically or regularly performed. In other example embodiments of the present disclosure, step S200 may be performed only when an external command is received.

In the method of controlling the charging voltage according to example embodiments of the present disclosure, the voltage level of the charging voltage may be set and changed adaptively and/or in real time based on the environmental information received from the environmental sensor such that the charging voltage is appropriate or suitable for a corresponding environment and there is no lack of power. Accordingly, the at least one capacitor included in the secondary power source may be efficiently derated, the lifetime (or lifespan) of the at least one capacitor may be increased, and thus the lifetime and reliability of the secondary power source may be increased.

Figure 2:
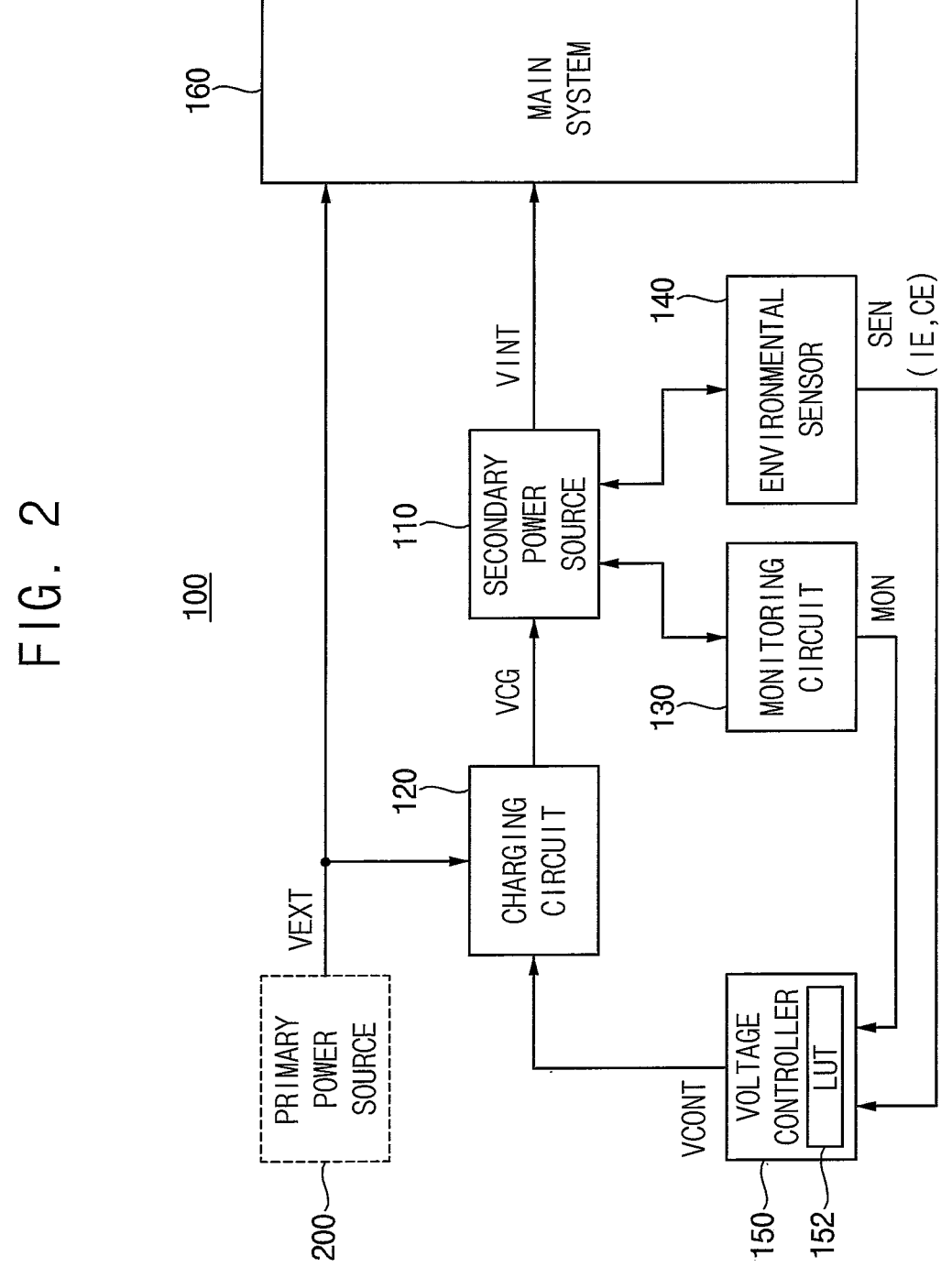
FIG. 2 is a block diagram illustrating an electronic device that performs a method of controlling a charging voltage according to example embodiments of the present disclosure.

FIG. 2 is a block diagram illustrating an electronic device that performs a method of controlling a charging voltage according to example embodiments of the present disclosure.

Referring to FIG. 2, an electronic device 100 includes a secondary power source 110, a charging circuit 120, a monitoring circuit 130, an environmental sensor 140, a voltage controller 150 and a main system 160.

The main system 160 performs various tasks and/or functions for an operation of the electronic device 100, and operates based on an external power supply voltage VEXT or an internal power supply voltage VINT.

The external power supply voltage VEXT may be provided or supplied from a primary power source (or a main power device) 200 that is located or disposed outside the electronic device 100. The internal power supply voltage VINT may be provided or supplied from the secondary power source 110 that is located or disposed inside the electronic device 100. A scheme of supplying power to the main system 160 may be changed depending on whether the external power supply voltage VEXT is normally supplied to the electronic device 100, which will be described more fully with reference to FIGS. 19A and 19B.

In some example embodiments of the present disclosure, the electronic device 100 may be a storage device that is used as a storage medium. For example, when the electronic device 100 is a storage device, the main system 160 may include a storage controller, a plurality of nonvolatile memories and a buffer memory. Detailed configurations of the storage device and components included in the storage device will be described with reference to FIGS. 4 through 6. However, the present disclosure is not limited thereto, and the electronic device 100 may be one of various electronic devices.

The secondary power source 110 includes at least one capacitor, is charged based on a charging voltage VCG, and generates the internal power supply voltage VINT. A detailed configuration of the secondary power source 110 will be described with reference to FIGS. 3A, 3B and 3C.

The charging circuit 120 generates the charging voltage VCG based on the external power supply voltage VEXT and a charging voltage control signal VCONT. For example, the charging circuit 120 may generate the charging voltage VCG based on the external power supply voltage VEXT, and may adjust and/or change a voltage level of the charging voltage VCG based on the charging voltage control signal VCONT.

In some example embodiments of the present disclosure, the charging circuit 120 may include a direct current (DC)-DC converter that converts the external power supply voltage VEXT, which is a DC voltage, into the charging voltage VCG, which is a DC voltage. For example, the charging circuit 120 may have a configuration corresponding to a buck converter that converts a relatively high DC voltage into a relatively low DC voltage. As another example, the charging circuit 120 may have a configuration corresponding to a boost converter that converts a relatively low DC voltage into a relatively high DC voltage. Alternatively, the charging circuit 120 may have a configuration corresponding to a buck-boost converter that converts an input DC voltage into a relatively high DC voltage and a relatively low DC voltage.

The monitoring circuit 130 monitors a present capacitance of the secondary power source 110, and generates a monitoring signal MON that represents the present capacitance. In other words, the monitoring circuit 130 may perform a monitoring operation on the secondary power source 110. The monitoring operation may be referred to as a capacitor health monitoring (CHM) operation.

In some example embodiments of the present disclosure, the charging circuit 120 and the monitoring circuit 130 may be included in the same chip (or the same integrated circuit (IC)). In other example embodiments of the present disclosure, the charging circuit 120 and the monitoring circuit 130 may be included in different chips. Detailed arrangements of the charging circuit 120 and the monitoring circuit 130 will be described with reference to FIGS. 18A and 18B.

The environmental sensor 140 detects an operating environment of the secondary power source 110 and/or the electronic device 100, and generates a sensing signal SEN that represents the operating environment. The sensing signal SEN may include initial environmental information IE and present environmental information CE. In other words, the environmental sensor 140 may generate the initial environmental information IE and the present environmental information CE.

In some example embodiments of the present disclosure, the environmental sensor 140 may include a temperature sensor, a humidity sensor, a pressure sensor, a motion sensor, a temporal sensor, a spatial sensor, an illumination sensor, an acceleration sensor, a vibration sensor, a mechanical stress sensor or a shock sensor. In other words, the operating environment may include temperature, humidity, pressure, motion, time, space, illuminance, acceleration, vibration, mechanical stress or shock. However, the present disclosure is not limited thereto, and the environmental sensor 140 may further include at least one sensor that collects environmental information, such as an external force sensor, a radiation sensor, a dust sensor, an electrical stress sensor, or the like.

The voltage controller 150 generates the charging voltage control signal VCONT based on the present capacitance, the initial environmental information IE and the present environmental information CE (e.g., in response to the monitoring signal MON and the sensing signal SEN). For example, the voltage controller 150 may include a lookup table (LUT) 152 that is used to generate the charging voltage control signal VCONT. A detailed configuration of the lookup table 152 will be described with reference to FIGS. 10, 13 and 16.

The electronic device 100, and the charging circuit 120, the monitoring circuit 130, the environmental sensor 140 and the voltage controller 150 that are included in the electronic device 100 may perform the method of controlling the charging voltage according to example embodiments of the present disclosure. In some example embodiments of the present disclosure, as described with reference to FIG. 1, the voltage level of the charging voltage VCG may be set and changed based on the environmental information received from the environmental sensor 140. In other example embodiments of the present disclosure, as will be described with reference to FIGS. 11 and 15, a scheme of setting and changing the voltage level of the charging voltage VCG may be changed depending on a characteristic of the at least one capacitor included in the secondary power source 110. In still other example embodiments of the present disclosure, as will be described with reference to FIG. 17, the voltage level of the charging voltage VCG may be set and changed in consideration of both the capacitance of the at least one capacitor and the environmental information.

Figure 3A:
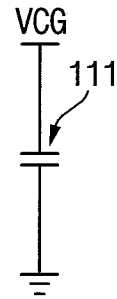
FIGS. 3A, 3B and 3C are circuit diagrams illustrating examples of a secondary power source that is included in an electronic device according to example embodiments of the present disclosure.
Figure 3B:
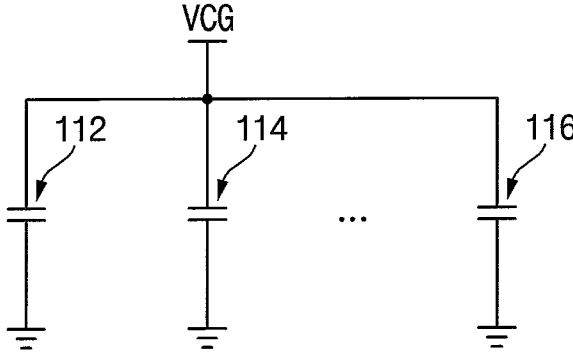
Figures 3C, 4:
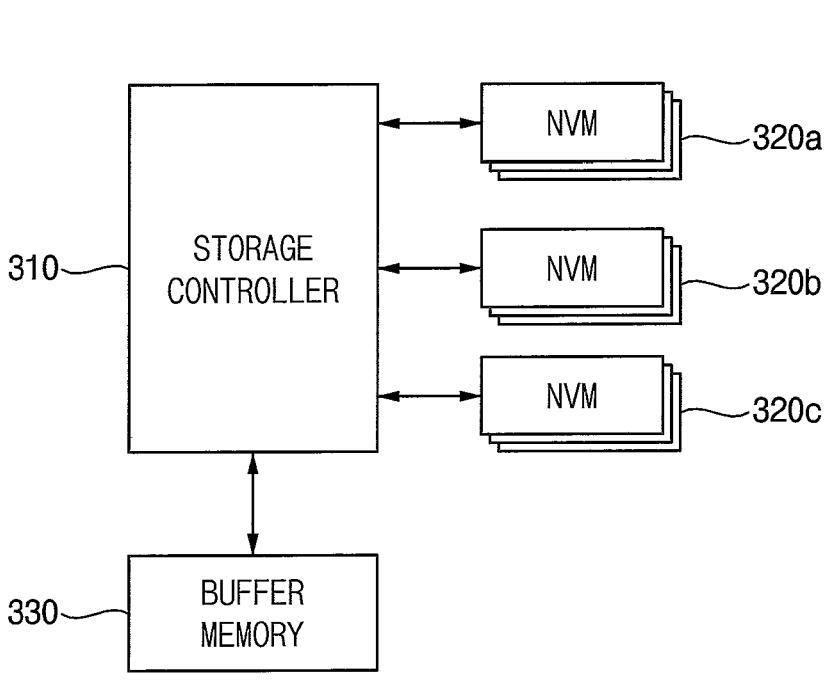
FIG. 4 is a block diagram illustrating an example of a main system that is included in an electronic device of FIG. 2.

FIGS. 3A, 3B and 3C are circuit diagrams illustrating examples of a secondary power source that is included in an electronic device according to example embodiments of the present disclosure.

Referring to FIG. 3A, a secondary power source 110a may include one capacitor 111. The capacitor 111 may be connected between the charging voltage VCG and a ground voltage, and may be charged based on the charging voltage VCG Referring to FIG. 3B, a secondary power source 110b may include a plurality of capacitors 112, 114 and 116. The plurality of capacitors 112, 114 and 116 may be connected in parallel between the charging voltage VCG and the ground voltage, and may be charged based on the charging voltage VCG In some example embodiments of the present disclosure, the plurality of capacitors 112, 114 and 116 may be homogeneous capacitors having the same characteristic. In this example, the plurality of capacitors 112, 114 and 116 may be charged based on the same charging voltage (e.g., based on the charging voltage VCG), and the voltage level of the charging voltage VCG may be adjusted based on the same control scheme.

Referring to FIG. 3C, a secondary power source 110c may include a plurality of capacitors 113, 115, 117 and 119. The first capacitors 113 and 115 among the plurality of capacitors 113, 115, 117 and 119 may be connected in parallel between a first charging voltage VCG1 and the ground voltage, and may be charged based on a first charging voltage VCG1. The second capacitors 117 and 119 among the plurality of capacitors 113, 115, 117 and 119 may be connected in parallel between a second charging voltage VCG2 and the ground voltage, and may be charged based on the second charging voltage VCG2.

In some example embodiments of the present disclosure, the plurality of capacitors 113, 115, 117 and 119 may be homogeneous capacitors having the same characteristic. In this example, the plurality of capacitors 113, 115, 117 and 119 may be charged based on different charging voltages (e.g., based on the first and second charging voltages VCG1 and VCG2), however, voltage levels of the first and second charging voltages VCG1 and VCG2 may be adjusted based on the same control scheme.

In other example embodiments of the present disclosure, the plurality of capacitors 113, 115, 117 and 119 may be heterogeneous capacitors having different characteristics. For example, the first capacitors 113 and 115 may have a first characteristic, and the second capacitors 117 and 119 may have a second characteristic different from the first characteristic. In this example, the plurality of capacitors 113, 115, 117 and 119 may be charged based on different charging voltages (e.g., based on the first and second charging voltages VCG1 and VCG2), and the voltage levels of the first and second charging voltages VCG1 and VCG2 may be adjusted based on different control schemes. Examples in which a scheme of adjusting the voltage levels of the charging voltages VCG1 and VCG2 is changed depending on the characteristics of the capacitors will be described with reference to FIGS. 11 and 15.

In some example embodiments of the present disclosure, the first capacitors 113 and 115 may form one secondary power source, and the second capacitors 117 and 119 may form another secondary power source.

FIG. 4 is a block diagram illustrating an example of a main system that is included in an electronic device of FIG. 2.

Referring to FIG. 4, a main system 300 may include a storage controller 310, a plurality of nonvolatile memories (NVMs) 320a, 320b and 320c, and a buffer memory 330. FIG. 4 illustrates a configuration of the main system 300 when the electronic device 100 of FIG. 2 is a storage device.

The storage controller 310 may control an operation of a storage device including the main system 300 and/or operations of the plurality of nonvolatile memories 320a, 320b and 320c based on a command and data that are received from an external host device.

The plurality of nonvolatile memories 320a, 320b and 320c may be controlled by the storage controller 310, and may store a plurality of data. For example, the plurality of nonvolatile memories 320a, 320b and 320c may store meta data, various user data, or the like.

In some example embodiments of the present disclosure, each of the plurality of nonvolatile memories 320a, 320b and 320c may include a NAND flash memory. In other example embodiments of the present disclosure, each of the plurality of nonvolatile memories 320a, 320b and 320c may include an electrically erasable programmable read only memory (EEPROM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

The buffer memory 330 may be controlled by the storage controller 310, may store instructions and/or data that are executed and/or processed by the storage controller 310, and may temporarily store data stored in or to be stored into the plurality of nonvolatile memories 320a, 320b and 320c. For example, the buffer memory 330 may include at least one of various volatile memories, e.g., a dynamic random access memory (DRAM), or the like.

In some example embodiments of the present disclosure, the storage device may be a solid state drive (SSD). In other example embodiments of the present disclosure, the storage device may be a universal flash storage (UFS), a multi media card (MMC) or an embedded multi media card (eMMC). In still other example embodiments of the present disclosure, the storage device may be one of a secure digital (SD) card, a micro SD card, a memory stick, a chip card, a universal serial bus (USB) card, a smart card, a compact flash (CF) card, or the like.

In some example embodiments of the present disclosure, the storage device may be connected to the host device via a block accessible interface which may include, for example, a UFS, an eMMC, a serial advanced technology attachment (SATA) bus, a nonvolatile memory express (NVMe) bus, a small computer system interface (SCSI) bus, a serial attached SCSI (SAS) bus, or the like. The storage device may use a block accessible address space corresponding to an access size of the plurality of nonvolatile memories 320a, 320b and 320c and provide the block accessible interface to the host device, to allow access by units of a memory block with respect to data stored in the plurality of nonvolatile memories 320a, 320b and 320c.

Figure 5:
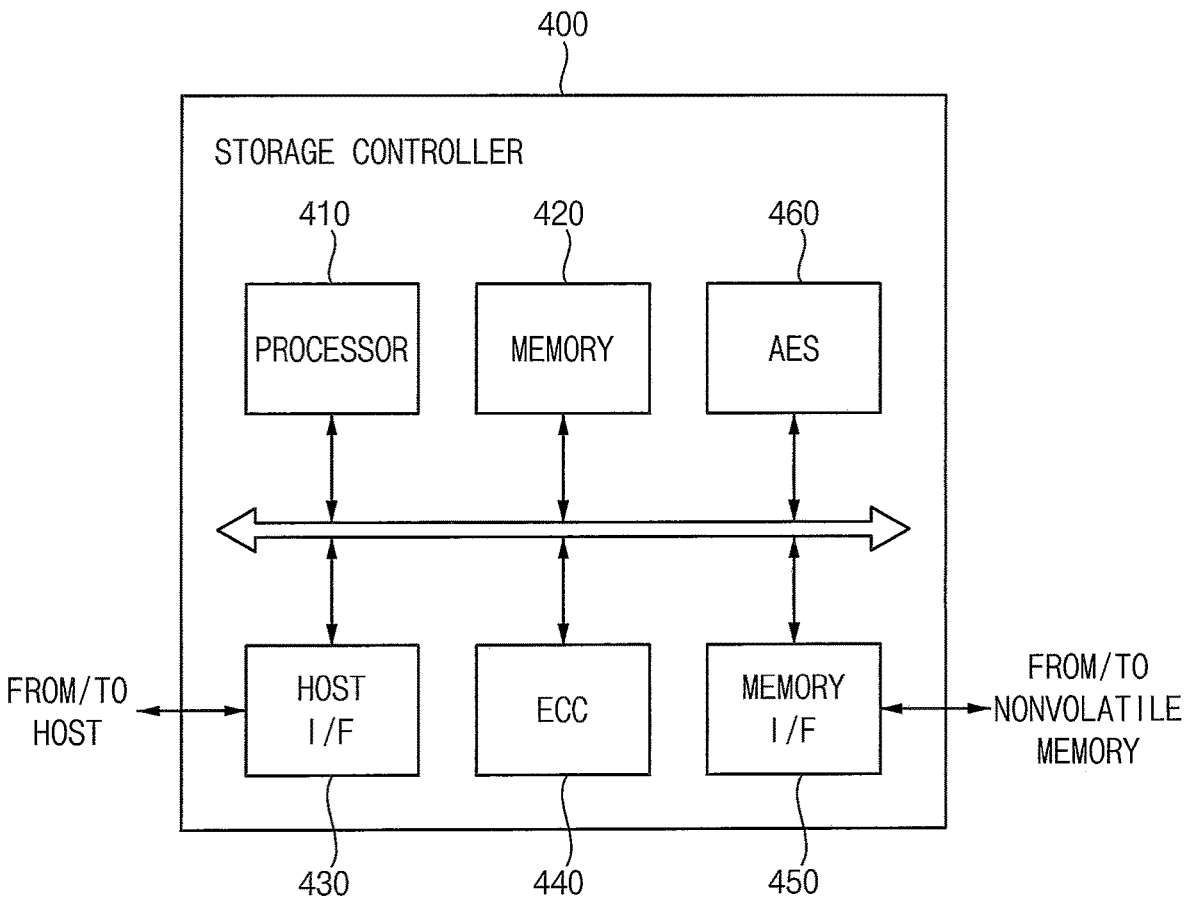
FIG. 5 is a block diagram illustrating an example of a storage controller that is included in a main system of FIG. 4.

FIG. 5 is a block diagram illustrating an example of a storage controller that is included in a main system of FIG. 4.

Referring to FIG. 5, a storage controller 400 may include at least one processor 410, a memory 420, a host interface (I/F) 430, an error correction code (ECC) engine 440, a memory interface 450 and an advanced encryption standard (AES) engine 460.

The processor 410 may control an operation of the storage controller 400 in response to a command received via the host interface 430 from an external host device. In some example embodiments of the present disclosure, the processor 410 may control respective components by employing firmware for operating a storage device including the storage controller 400.

The memory 420 may store instructions and data that are executed and processed by the processor 410. For example, the memory 420 may include a volatile memory, such as a DRAM, a static random access memory (SRAM), a cache memory, or the like.

The ECC engine 440 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The host interface 430 may provide physical connections between the host device and the storage device. The host interface 430 may provide an interface corresponding to a bus format of the host for communication between the host device and the storage device. In some example embodiments of the present disclosure, the bus format of the host device may be a SCSI or a SAS interface. In other example embodiments of the present disclosure, the bus format of the host device may be a USB, a peripheral component interconnect express (PCIe), an advanced technology attachment (ATA), a parallel ATA (PATA), a SATA, an NVMe, etc., format.

The memory interface 450 may exchange data with nonvolatile memories (e.g., the nonvolatile memories 320a, 320b and 320c in FIG. 4) included in the storage device. The memory interface 450 may transfer data to the nonvolatile memories, or may receive data read from the nonvolatile memories. In some example embodiments of the present disclosure, the memory interface 450 may be connected to the nonvolatile memories via one channel. In other example embodiments of the present disclosure, the memory interface 450 may be connected to the nonvolatile memories via two or more channels. For example, the memory interface 450 may be configured to comply with a standard protocol, such as Toggle or open NAND flash interface (ONFI).

The AES engine 460 may perform at least one of an encryption operation and a decryption operation on data input to the storage controller 400 by using a symmetric-key algorithm. The AES engine 460 may include an encryption module and a decryption module. For example, the encryption module and the decryption module may be implemented as separate modules. As another example, one module capable of performing both encryption and decryption operations may be implemented in the AES engine 460.

Figure 6:
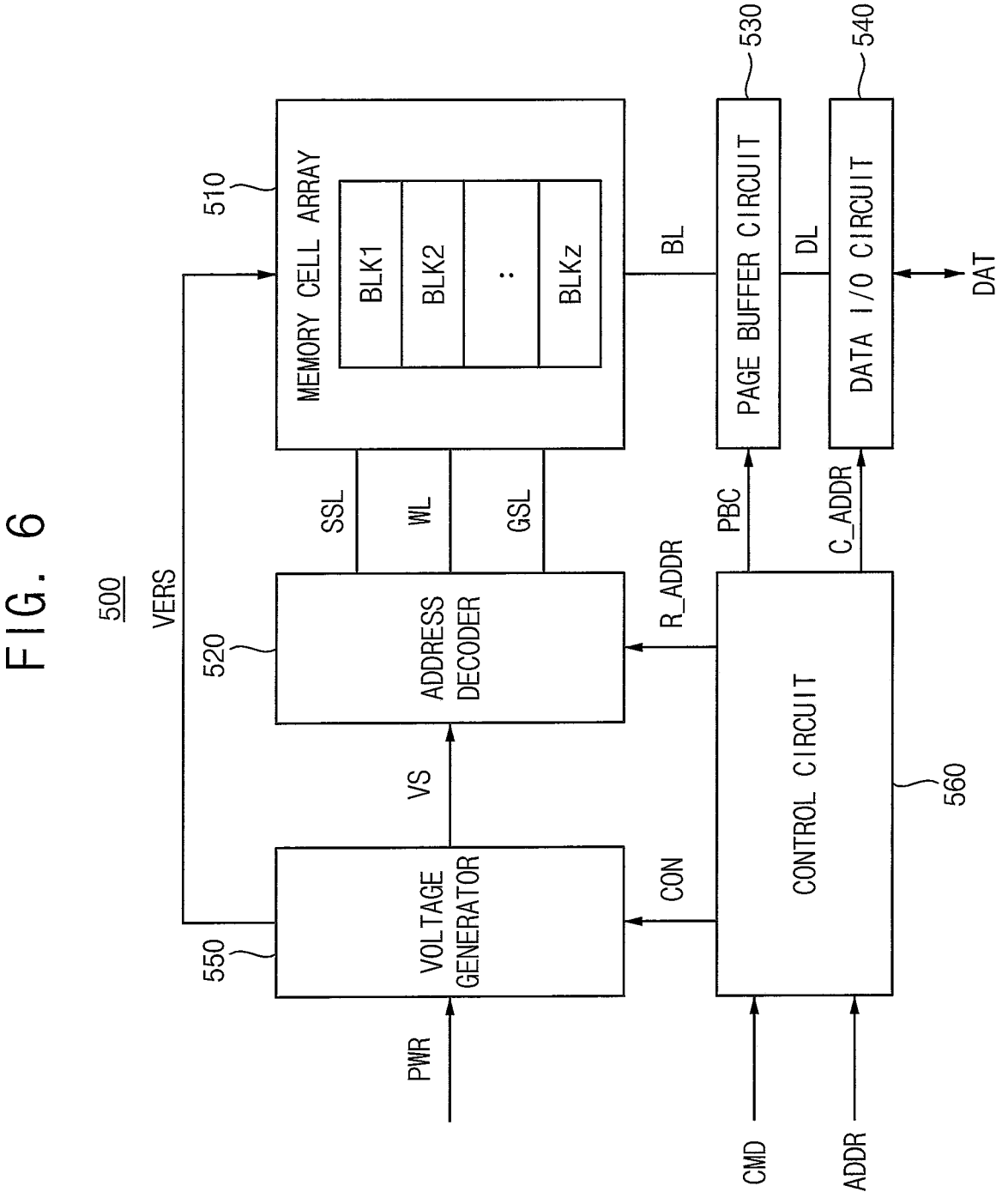
FIG. 6 is a block diagram illustrating an example of a nonvolatile memory that is included in a main system of FIG. 4.

FIG. 6 is a block diagram illustrating an example of a nonvolatile memory that is included in a main system of FIG. 4.

Referring to FIG. 6, a nonvolatile memory 500 may include a memory cell array 510, an address decoder 520, a page buffer circuit 530, a data input/output (I/O) circuit 540, a voltage generator 550 and a control circuit 560.

The memory cell array 510 may be connected to the address decoder 520 via a plurality of string selection lines SSL, a plurality of wordlines WL and a plurality of ground selection lines GSL. The memory cell array 510 may be further connected to the page buffer circuit 530 via a plurality of bitlines BL. The memory cell array 510 may include a plurality of memory cells (e.g., a plurality of nonvolatile memory cells) that are connected to the plurality of wordlines WL and the plurality of bitlines BL. The memory cell array 510 may be divided into a plurality of memory blocks BLK1, BLK2, . . . , BLKz each of which includes memory cells. In addition, each of the plurality of memory blocks BLK1, BLK2, . . . , BLKz may be divided into a plurality of pages.

In some example embodiments of the present disclosure, the plurality of memory cells may be arranged in a two-dimensional (2D) array structure or a three-dimensional (3D) vertical array structure. A 3D vertical array structure may include vertical cell strings that are vertically oriented such that at least one memory cell is located over another memory cell. The at least one memory cell may comprise a charge trap layer. The following patent documents, which are hereby incorporated by reference in their entirety, describe configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and U.S. Pat. Pub. No. 2011/0233648.

The control circuit 560 may receive a command CMD and an address ADDR from the outside (e.g., the host device and/or the storage controller), and may control erasure, programming and read operations of the nonvolatile memory 500 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and a data recovery read operation.

For example, the control circuit 560 may generate control signals CON, which are used for controlling the voltage generator 550, and may generate control signal PBC for controlling the page buffer circuit 530, based on the command CMD, and may generate a row address R_ADDR and a column address C_ADDR based on the address ADDR. The control circuit 560 may provide the row address R_ADDR to the address decoder 520 and may provide the column address C_ADDR to the data I/O circuit 540.

The address decoder 520 may be connected to the memory cell array 510 via the plurality of string selection lines SSL, the plurality of wordlines WL and the plurality of ground selection lines GSL.

For example, in the data erase/write/read operations, the address decoder 520 may determine at least one of the plurality of wordlines WL as a selected wordline, and may determine the rest or remainder of the plurality of wordlines W L other than the selected wordline as unselected wordlines, based on the row address R_ADDR.

In addition, in the data erase/write/read operations, the address decoder 520 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the address decoder 520 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 550 may generate voltages VS that are required for an operation of the nonvolatile memory 500 based on a power PWR and the control signals CON. The power PWR may be provided from the primary power source 200 or the secondary power source 110. The voltages VS may be applied to the plurality of string selection lines SSL, the plurality of wordlines WL and the plurality of ground selection lines GSL via the address decoder 520. In addition, the voltage generator 550 may generate an erase voltage VERS that is required for the data erase operation based on the power PWR and the control signals CON. The erase voltage VERS may be applied to the memory cell array 510 directly or via the bitline BL.

For example, during the erase operation, the voltage generator 550 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the address decoder 520. In addition, during the erase verification operation, the voltage generator 550 may apply an erase verification voltage simultaneously to all wordlines of the memory block or sequentially to the wordlines one by one.

For example, during the program operation, the voltage generator 550 may apply a program voltage to the selected wordline and may apply a program pass voltage to the unselected wordlines via the address decoder 520. In addition, during the program verification operation, the voltage generator 550 may apply a program verification voltage to the selected wordline and may apply a verification pass voltage to the unselected wordlines via the address decoder 520.

In addition, during the normal read operation, the voltage generator 550 may apply a read voltage to the selected wordline and may apply a read pass voltage to the unselected wordlines via the address decoder 520. During the data recovery read operation, the voltage generator 550 may apply the read voltage to a wordline adjacent to the selected wordline and may apply a recovery read voltage to the selected wordline via the address decoder 520.

The page buffer circuit 530 may be connected to the memory cell array 510 via the plurality of bitlines BL. The page buffer circuit 530 may include a plurality of page buffers. In some example embodiments of the present disclosure, each page buffer may be connected to one bitline. In other example embodiments of the present disclosure, each page buffer may be connected to two or more bitlines.

The page buffer circuit 530 may store data DAT to be programmed into the memory cell array 510 or may read data DAT sensed from the memory cell array 510. In other words, the page buffer circuit 530 may operate as a write driver or a sensing amplifier according to an operation mode of the nonvolatile memory 500.

The data I/O circuit 540 may be connected to the page buffer circuit 530 via data lines DL. The data I/O circuit 540 may provide the data DAT from an outside of the nonvolatile memory 500 to the memory cell array 510 via the page buffer circuit 530 or may provide the data DAT from the memory cell array 510 to the outside of the nonvolatile memory 500, based on the column address C_ADDR.

Figure 7:
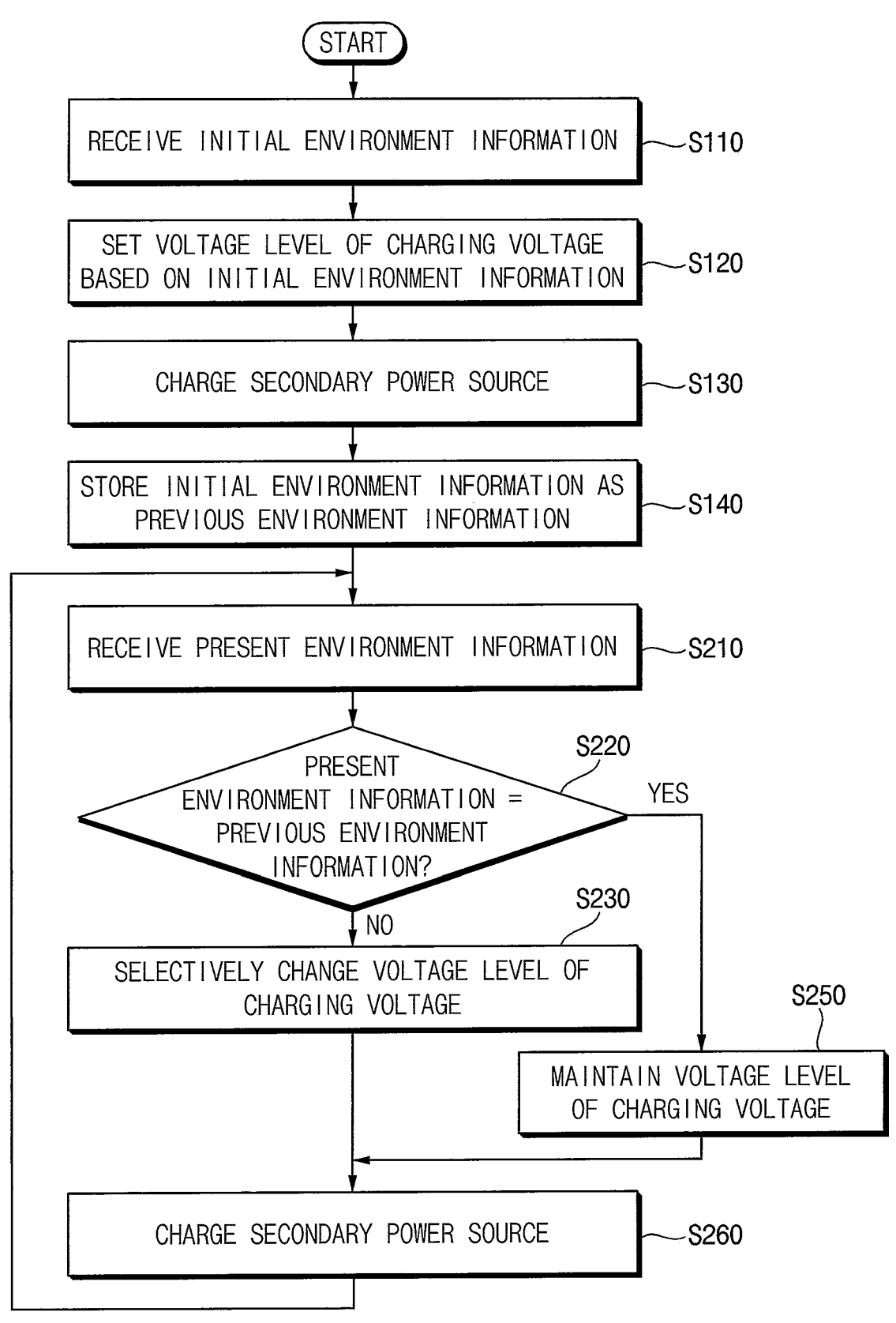
FIG. 7 is a flowchart illustrating an example of a method of controlling a charging voltage of FIG. 1.

FIG. 7 is a flowchart illustrating an example of a method of controlling a charging voltage of FIG. 1.

Referring to FIGS. 1 and 7, when setting the voltage level of the charging voltage and charging the secondary power source based on the initial environmental information (step S100 of FIG. 1), the initial environmental information may be received from the environmental sensor (step S110), and the voltage level of the charging voltage may be set based on the initial environmental information (step S120). For example, the voltage level of the charging voltage may be set to the first voltage level, which is an initial voltage level. For example, step S110 may be performed by the voltage controller 150 in FIG. 2. For example, the voltage controller 150 may receive the initial environmental information from the environmental sensor 140. Step S120 may be performed by the voltage controller 150 and the charging circuit 120 in FIG. 2. For example, the voltage controller 150 may provide the charging voltage control signal VCONT to the charging circuit 120.

The secondary power source may be charged based on the charging voltage that is set in step S120 (step S130). For example, the secondary power source may be charged based on the charging voltage having the first voltage level.

The initial environmental information may be stored as previous environmental information (step S140). For example, step S140 may be performed by the voltage controller 150 in FIG. 2. For example, the voltage controller 150 may store the previous environmental information in the lookup table (LUT) 152.

After step S100 of FIG. 1, when selectively changing the voltage level of the charging voltage and charging the secondary power source based on the present environmental information (step S200 of FIG. 1), the present environmental information may be received from the environmental sensor (step S210), and the present environmental information may be compared with the previous environmental information (step S220). For example, steps S210 and S220 may be performed by the voltage controller 150 in FIG. 2. For example, the voltage controller 150 may compare the present or current environmental information with the previous environmental information stored in the lookup table (LUT) 152.

When the present environmental information is changed or different from the previous environmental information (or in response to the present environmental information being changed from the previous environmental information) (step S220: NO), the voltage level of the charging voltage may be selectively changed based on the changed environmental information (e.g., the present environmental information) (step S230). The present environmental information may be changed or different from the previous environmental information when the operating environment of the electronic device 100 is changed. As a result, the voltage level of the charging voltage may be selectively changed to the second voltage level different from the first voltage level. The second voltage level may be greater than or less than the first voltage level. Step S230 may be performed by the monitoring circuit 130, the voltage controller 150 and the charging circuit 120 in FIG. 2. Step S230 will be described with reference to FIG. 8.

When the present environmental information is substantially equal to or the same as the previous environmental information (or in response to the present environmental information being equal to the previous environmental information) (step S220: YES), the voltage level of the charging voltage may be maintained (step S250). The present environmental information may be substantially equal to or the same as the previous environmental information when the operating environment of the electronic device 100 is unchanged and maintained. As a result, the voltage level of the charging voltage may be maintained to the first voltage level. Step S250 may be performed by the voltage controller 150 and the charging circuit 120 in FIG. 2. The present environmental information may be deemed substantially equal to of the same as the previous environmental information if is within a predetermined threshold range of the previous environmental information, for example.

The secondary power source may be charged based on a result of performing step S230 or step S250 (step S260). For example, when the operating environment is changed and step S230 is performed, the secondary power source may be charged based on the charging voltage in which the voltage level is selectively changed (e.g., based on the charging voltage having the first voltage level or the second voltage level). When the operating environment is maintained and step S250 is performed, the secondary power source may be charged based on the charging voltage in which the voltage level is maintained (e.g., based on the charging voltage having the first voltage level).

Steps S210, S220, S230, S250 and S260 may be repeatedly performed while the secondary power source and the electronic device including the secondary power source are operating.

In some example embodiments of the present disclosure, steps S210, S220, S230, S250 and S260 may be periodically or regularly performed. For example, the electronic device 100 of FIG. 2 may include a timer, a counter, or the like, that are used to periodically perform steps S210, S220, S230, S250 and S260.

In other example embodiments of the present disclosure, steps S210, S220, S230, S250 and S260 may be performed based on an external command. For example, the external command may be provided from an external host device and/or a controller (e.g., the storage controller 310 in FIG. 4) that is included in the main system 160 in the electronic device 100 of FIG. 2.

Figure 8:
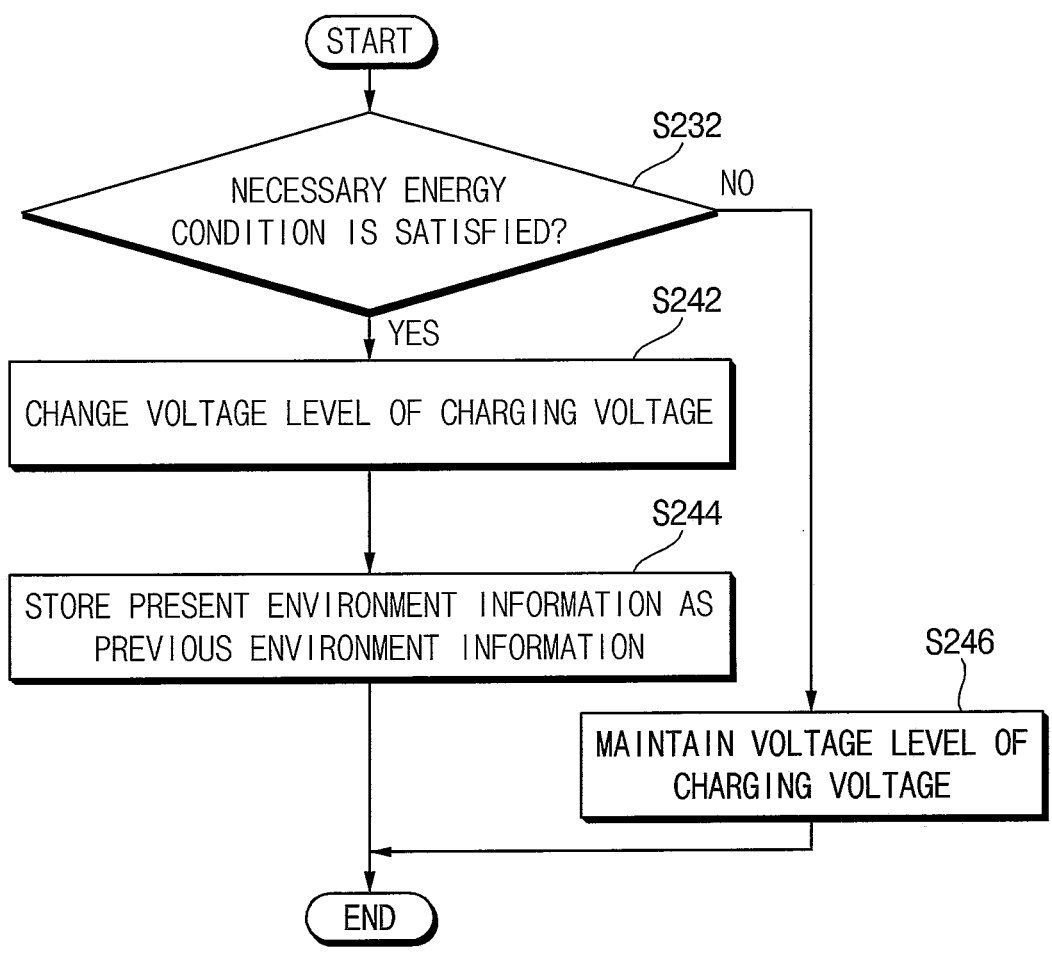
FIG. 8 is a flowchart illustrating an example of selectively changing a voltage level of a charging voltage in FIG. 7.

FIG. 8 is a flowchart illustrating an example of selectively changing a voltage level of a charging voltage in FIG. 7.

Referring to FIGS. 1, 7 and 8, when selectively changing the voltage level of the charging voltage (step S230 in FIG. 7), it may be determined whether the secondary power source satisfies a necessary (or required) energy condition corresponding to the present environmental information (e.g., the changed environmental information) (step S232). For example, step S232 may be performed by the monitoring circuit 130 and the voltage controller 150 in FIG. 2. Step S232 will be described in further detail with reference to FIG. 9.

When the secondary power source satisfies the necessary energy condition (or in response to the secondary power source satisfying the necessary energy condition) (step S232: YES), the voltage level of the charging voltage may be changed (step S242). For example, the voltage level of the charging voltage may be changed to the second voltage level that is different from the first voltage level and corresponds to the present environmental information. The second voltage level may be referred to as an expected change voltage level corresponding to the changed environmental information. In other words, when the operating environment is changed and there is also sufficient energy for the voltage level to be changed (e.g., there is also sufficient energy associated with the expected change voltage level), the voltage level of the charging voltage may be changed.

For example, step S242 may be performed by the voltage controller 150 and the charging circuit 120 in FIG. 2.

After the voltage level of the charging voltage is changed in step S242, the present environmental information may be stored as the previous environmental information (step S244). In other words, the environmental information may be updated. For example, step S242 may be performed by the voltage controller 150 in FIG. 2. For example, the lookup table 152 may be updated with the present environmental information.

When the secondary power source does not satisfy the necessary energy condition (or in response to the secondary power source not satisfying the necessary energy condition) (step S232: NO), the voltage level of the charging voltage may be maintained (step S246). For example, the voltage level of the charging voltage may be maintained to the first voltage level. In other words, when energy for the voltage level to be changed is not sufficient (e.g., energy associated with the expected change voltage level is not sufficient) even if the operating environment is changed, the voltage level of the charging voltage may be unchanged and may be maintained. Step S246 may be similar to step S250 in FIG. 7.

Figure 9:
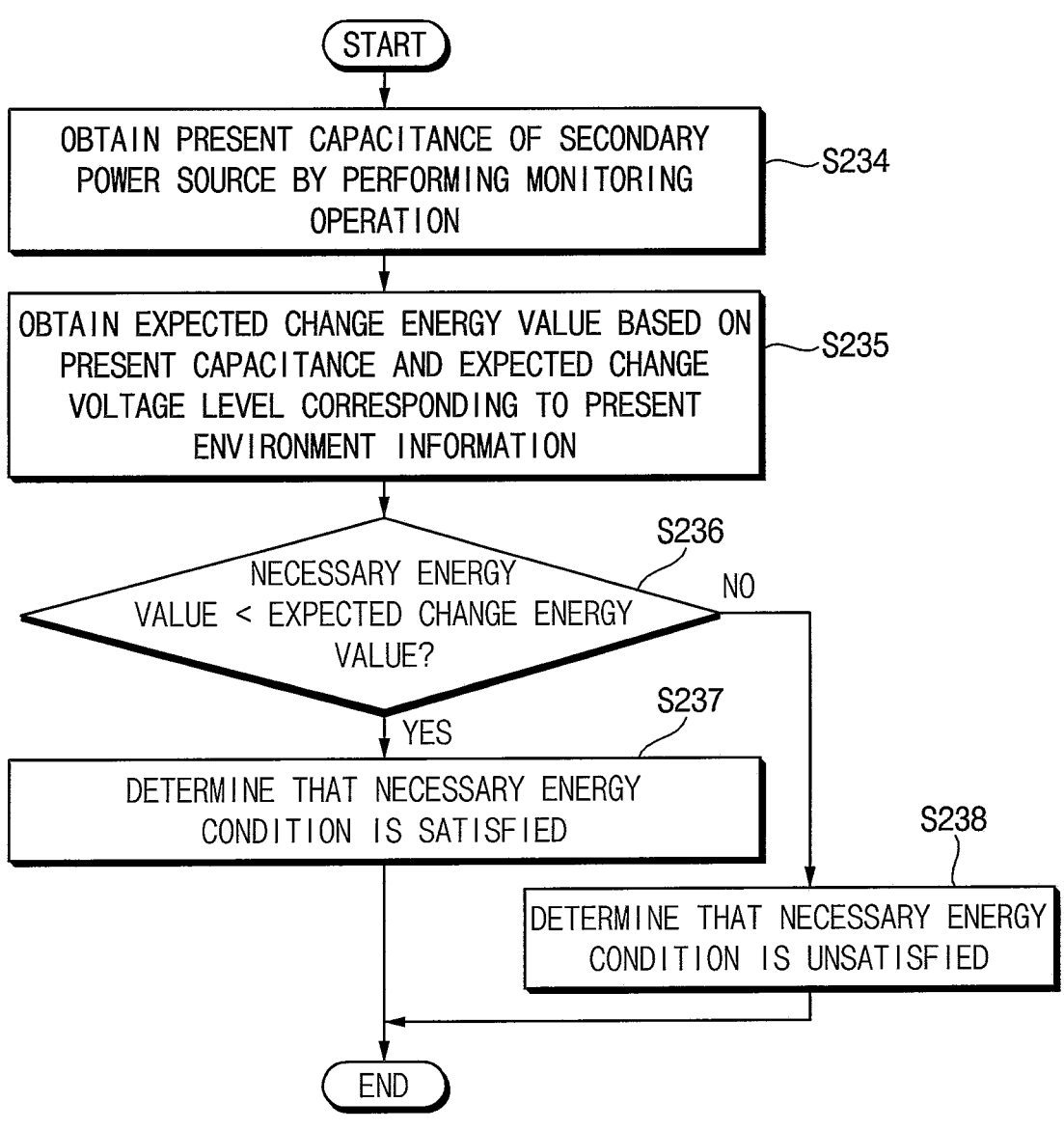
FIG. 9 is a flowchart illustrating an example of determining whether a secondary power source satisfies an energy condition in FIG. 8.

FIG. 9 is a flowchart illustrating an example of determining whether a secondary power source satisfies a necessary energy condition in FIG. 8.

Referring to FIGS. 1, 7, 8 and 9, when determining whether the secondary power source satisfies the necessary energy condition (step S232 of FIG. 8), the present capacitance of the secondary power source may be obtained by performing a monitoring operation (step S234). For example, the present capacitance may be obtained by measuring a charging time required for charging the secondary power source and a discharging time required for discharging the secondary power source based on the charging voltage. For example, step S234 may be performed by the monitoring circuit 130 in FIG. 2.

An expected change energy value may be obtained based on the present capacitance and the expected change voltage level (e.g., the second voltage level) corresponding to the present environmental information (e.g., the changed environmental information) (step S235). In other words, the expected change energy value may be determined by using the present capacitance and second voltage level. A necessary energy value may be compared with the expected change energy value (step S236). For example, the necessary energy value may represent a reference value for determining whether to change the voltage level of the charging voltage, and may be predetermined in a design process of the secondary power source. The necessary energy value may be referred to as a power-loss protection (PLP) necessary energy value, an energy threshold value or a reference energy value. For example, steps S235 and S236 may be performed by the voltage controller 150 in FIG. 2.

When the necessary energy value is less than the expected change energy value (or in response to the necessary energy value being less than the expected change energy value) (step S236: YES), e.g., when the expected change energy value is greater than or equal to the necessary energy value, it may be determined that the necessary energy condition is satisfied (step S237), and thus, the voltage level of the charging voltage may be changed by performing S242 in FIG. 8. When the necessary energy value is greater than or equal to the expected change energy value (or in response to the necessary energy value being greater than or equal to the expected change energy value) (step S236: NO), e.g., when the expected change energy value is less than the necessary energy value, it may be determined that the necessary energy condition is not satisfied (step S238), and thus, the voltage level of the charging voltage may be maintained by performing S246 in FIG. 8. For example, steps S237 and S238 may be performed by the voltage controller 150 in FIG. 2.

In some example embodiments of the present disclosure, after the voltage level of the charging voltage is changed to the second voltage level and the environmental information is updated by performing steps S220, S230, S232, S242 and S244 as described with reference to FIGS. 7, 8 and 9, steps S210 and S220 may be performed again. When it is determined that the operating environment is changed again by performing steps S210 and S220 again, the voltage level of the charging voltage may be selectively changed to a third voltage level different from the first and second voltage levels, or the voltage level of the charging voltage may be selectively changed back to the first voltage level. In other words, the voltage level of the charging voltage may be increased, maintained or decreased over time.

Figure 10:
FIG. 10 is a diagram for describing operations of FIGS. 7, 8 and 9.

FIG. 10 is a diagram for describing operations of FIGS. 7, 8 and 9.

Referring to FIG. 10, an example of a first lookup table LUT1 that is used to perform the operations of FIGS. 7, 8 and 9 is illustrated. For example, the first lookup table LUT1 may be included in the lookup table 152 in the voltage controller 150 of FIG. 2.

The first lookup table LUT1 may represent a relationship between the voltage level of the charging voltage and the environmental information. For example, environmental information ER11 and a voltage level V11 corresponding thereto may be referred to as a state S11, environmental information ER21 and a voltage level V21 corresponding thereto may be referred to as a state S21, and environmental information ER31 and a voltage level V31 corresponding thereto may be referred to as a state S31.

In some example embodiments of the present disclosure, each of the environmental information ER11, ER21 and ER31 may correspond to a specific value or a specific range. For example, when the environmental sensor 140 includes a temperature sensor, each of the environmental information ER11, ER21 and ER31 may represent a temperature value or a temperature range. For another example, when the environmental sensor 140 includes a humidity sensor, each of the environmental information ER11, ER21 and ER31 may represent a humidity value or a humidity range. As another example, when the environmental sensor 140 includes both a temperature sensor and a humidity sensor, each of the environmental information ER11, ER21 and ER31 may include temperature/humidity values or temperature/humidity ranges.

The operations of FIGS. 7, 8 and 9 will be described with reference to the first lookup table LUT1 as follows.

In step S110, when the initial environmental information IE corresponding to the environmental information ER11 is received (e.g., when an initial temperature value is included in a temperature range of the environmental information ER11), the voltage level of the charging voltage VCG may be set to the voltage level V11, and the secondary power source 110 may be charged based on the charging voltage VCG having the voltage level V11.

After that, in step S210, when the present environmental information CE corresponding to the environmental information ER21 is received (e.g., when a present temperature value is included in a temperature range of the environmental information ER21), the voltage level of the charging voltage VCG may be selectively changed to the voltage level V21, which is the expected change voltage level, based on the changed environmental information. For example, the present capacitance of the secondary power source 110 may be obtained, the expected change energy value may be obtained based on Equation 1, the voltage level of the charging voltage VCG may be changed to the voltage level V21 when the expected change energy value is greater than or equal to the necessary energy value, and the secondary power source 110 may be charged based on the charging voltage VCG having the voltage level V21.

$$CEV=0.5*CC*(V21)^2 \qquad \text{[Equation 1]}$$

In Equation 1, CEV denotes the expected change energy value, CC denotes the present capacitance, and V21 denotes the expected change voltage level.

In step S210, when the present environmental information CE corresponding to the environmental information ER11 is received (e.g., when the present temperature value is still included in the temperature range of the environmental information ER11), or when the expected change energy value is less than the necessary energy value even if the present environmental information CE corresponding to the environmental information ER21 is received, the voltage level of the charging voltage VCG may be maintained to the voltage level V11 without changing to the voltage level V21, and the secondary power source 110 may be charged based on the charging voltage VCG having the voltage level V11.

Figure 11:
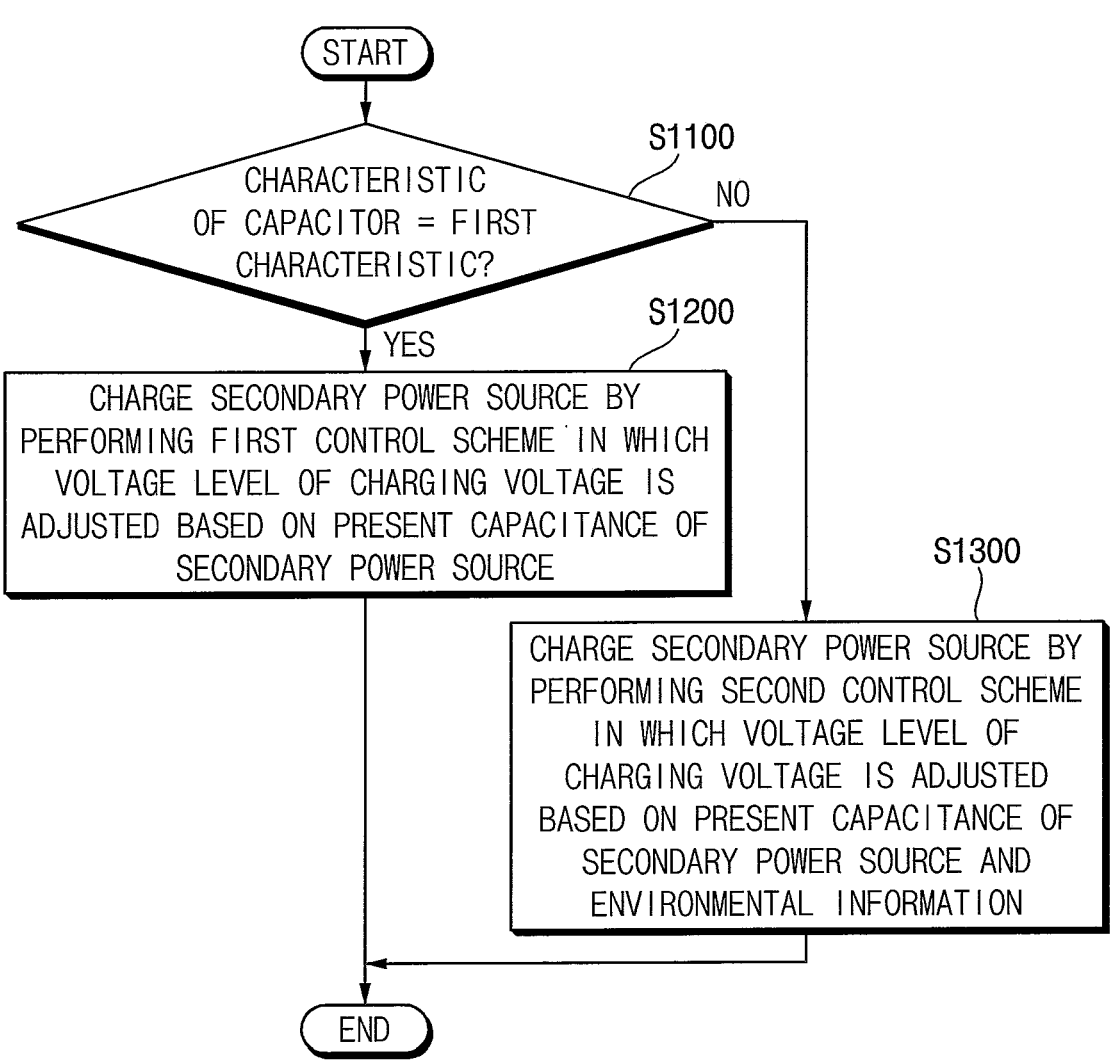
FIG. 11 is a flowchart illustrating a method of controlling a charging voltage according to example embodiments of the present disclosure.

FIG. 11 is a flowchart illustrating a method of controlling a charging voltage according to example embodiments of the present disclosure. The descriptions repeated with FIG. 1 will be omitted.

Referring to FIG. 11, in a method of controlling a charging voltage of FIG. 11 according to example embodiments of the present disclosure, a scheme of setting, adjusting and/or changing the voltage level of the charging voltage may be changed depending on a characteristic of the at least one capacitor included in the secondary power source.

For example, the characteristic of the at least one capacitor included in the secondary power source is determined (step S1100).

When the at least one capacitor has a first characteristic (or in response to the at least one capacitor having the first characteristic) (step S1100: YES), the secondary power source is charged by performing a first control scheme in which the voltage level of the charging voltage is adjusted based on the present capacitance of the secondary power source (step S1200). In the first control scheme of step S1200, the environmental information received from the environmental sensor may not be used. Step S1200 will be described in further detail with reference to FIGS. 12 through 14.

In some example embodiments of the present disclosure, the first characteristic may represent that the lifetime or remaining lifetime of the at least one capacitor decreases more rapidly as the voltage level of the charging voltage increases. In other words, the first characteristic may represent a case in which derating of the at least one capacitor is accelerated as the voltage level of the charging voltage increases.

When the at least one capacitor has a second characteristic different from the first characteristic (or in response to the at least one capacitor having the second characteristic) (step S1100: NO), the secondary power source is charged by performing a second control scheme in which the voltage level of the charging voltage is adjusted based on the present capacitance of the secondary power source and the environmental information received from the environmental sensor (step S1300). The second control scheme of step S1300 is different from the first control scheme as it involves the environmental information. For example, in the second control scheme of step S1300, the environmental information received from the environmental sensor may be used in conjunction with the present capacitance of the secondary power source.

In some example embodiments of the present disclosure, the second characteristic may represent that the lifetime or remaining lifetime of the at least one capacitor decreases more slowly as the voltage level of the charging voltage increases, or the lifetime or remaining lifetime of the at least one capacitor is irrelevant to the voltage level of the charging voltage. In other words, the second characteristic may represent a case in which the derating of the at least one capacitor is delayed as the voltage level of the charging voltage increases or the derating of the at least one capacitor is irrelevant to the voltage level of the charging voltage.

In some example embodiments of the present disclosure, step S1300 may be performed as described with reference to FIG. 1. For example, in the second control scheme, the initial voltage level of the charging voltage may be set using the initial environmental information and the voltage level of the charging voltage may be selectively changed using the present environment information, as in steps S100 and S200 of FIG. 1. For example, the second control scheme may be performed as described with reference to FIGS. 7 through 10. In other words, the example of FIG. 1 may be applied or employed to a case in which the at least one capacitor has the second characteristic.

In some example embodiments of the present disclosure, when the secondary power source is implemented as illustrated in FIGS. 3A, 3B and 3C, steps S1200 or S1300 may be performed on all capacitors included in the secondary power source. In other example embodiments of the present disclosure, when the secondary power source is implemented as illustrated in FIG. 3C, step S1200 may be performed for some capacitors and step S1300 may be performed for the other capacitors.

In the method of controlling the charging voltage according to example embodiments of the present disclosure, the voltage level of the charging voltage may be set and changed adaptively and/or in real time depending on the characteristic of the at least one capacitor included in the secondary power source. Accordingly, the at least one capacitor included in the secondary power source may be efficiently derated, the lifetime of the at least one capacitor may be increased, and thus the lifetime and reliability of the secondary power source may be increased.

Figure 12:
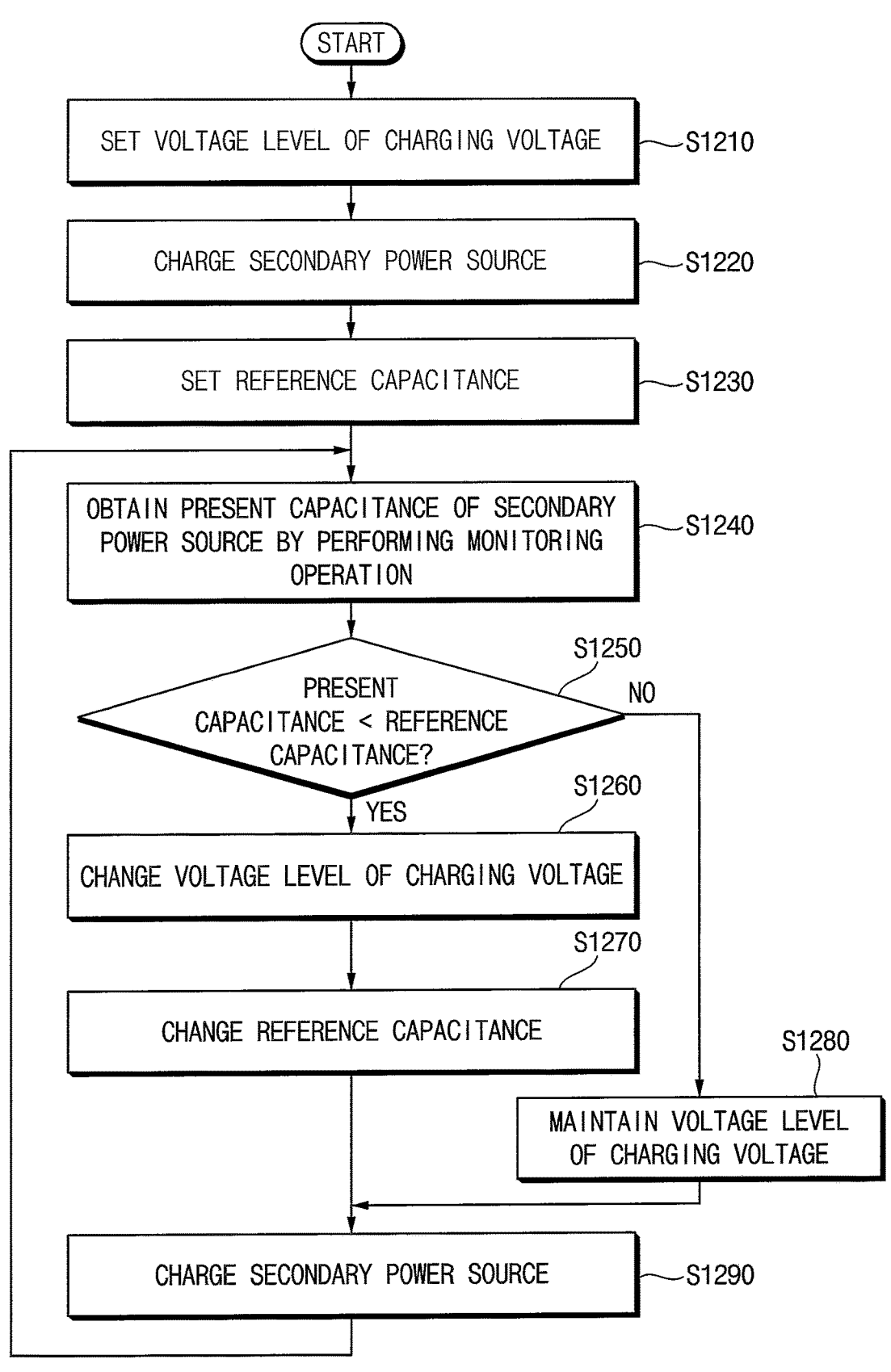
FIG. 12 is a flowchart illustrating an example of charging a secondary power source by performing a first control scheme in FIG. 11.

FIG. 12 is a flowchart illustrating an example of charging a secondary power source by performing a first control scheme in FIG. 11.

Referring to FIGS. 11 and 12, when charging the secondary power source by performing the first control scheme (step S1200), the voltage level of the charging voltage may be set (step S1210). For example, the voltage level of the charging voltage may be set to a first voltage level, which is an initial voltage level. For example, step S1210 may be performed by the voltage controller 150 and the charging circuit 120 in FIG. 2.

The secondary power source may be charged based on the charging voltage that is set in step S1210 (step S1220). For example, the secondary power source may be charged based on the charging voltage having the first voltage level.

A reference capacitance may be set (step S1230). For example, the reference capacitance may be set to a first reference capacitance, which is an initial reference capacitance. For example, the reference capacitance may represent a reference value for determining whether to change the voltage level of the charging voltage. The reference capacitance may be referred to as a threshold capacitance. For example, step S1230 may be performed by the voltage controller 150 in FIG. 2.

After step S1230, the present capacitance of the secondary power source may be obtained by performing a monitoring operation (step S1240). Step S1240 may be substantially the same as step S234 in FIG. 9.

The present capacitance may be compared with the reference capacitance (e.g., the first reference capacitance) (step S1250). For example, step S1250 may be performed by the voltage controller 150 in FIG. 2.

When the present capacitance is less than the reference capacitance (e.g., the first reference capacitance) (or in response to the present capacitance being less than the first reference capacitance) (step S1250: YES), the voltage level of the charging voltage may be changed (step S1260), and then the reference capacitance may be changed (step S1270). For example, the voltage level of the charging voltage may be changed to a second voltage level different from the first voltage level, and the reference capacitance may be changed to a second reference capacitance different from the first reference capacitance. In other words, the reference capacitance may be updated. For example, the second voltage level may be higher than the first voltage level, and the second reference capacitance may be less than the first reference capacitance. For example, step S1260 may be performed by the voltage controller 150 and the charging circuit 120 in FIG. 2, and step S1270 may be performed by the voltage controller 150 in FIG. 2.

When the present capacitance is greater than or equal to the reference capacitance (e.g., the first reference capacitance) (or in response to the present capacitance being greater than or equal to the first reference capacitance) (step S1250: NO), the voltage level of the charging voltage may be maintained (step S1280). For example, the voltage level of the charging voltage may be maintained to the first voltage level, and the reference capacitance may also be maintained to the first reference capacitance. For example, step S1280 may be performed by the voltage controller 150 and the charging circuit 120 in FIG. 2.

The secondary power source may be charged based on a result of performing step S1260 or step S1280 (step S1290). For example, when the present capacitance is less than the reference capacitance and step S1260 is performed, the secondary power source may be charged based on the charging voltage in which the voltage level is changed (e.g., based on the charging voltage having the second voltage level). When the present capacitance is greater than or equal to the reference capacitance and step S1280 is performed, the secondary power source may be charged based on the charging voltage in which the voltage level is maintained (e.g., based on the charging voltage having the first voltage level).

Steps S1240, S1250, S1260, S1270, S1280 and S1290 may be repeatedly performed while the secondary power source and the electronic device including the secondary power source are operating. As with that described with reference to FIG. 7, steps S1240, S1250, S1260, S1270, S1280 and S1290 may be periodically performed, or may be performed based on an external command.

In some example embodiments of the present disclosure, after the voltage level of the charging voltage is changed to the second voltage level and the reference capacitance is updated by performing steps S1250, S1260 and S1270 as described above, steps S1240 and S1250 may be performed again. When it is determined that the present capacitance is less than the reference capacitance (e.g., the second reference capacitance) by performing steps S1240 and S1250 again, the voltage level of the charging voltage may be changed to a third voltage level different from the first and second voltage levels, and the reference capacitance may be changed to a third reference capacitance different from the first and second reference capacitances. For example, the third voltage level may be higher than the first and second voltage levels, and the third reference capacitance may be less than the first and second reference capacitances. In this example, the voltage level the charging voltage may be increased or maintained over time, but may not be decreased.

Figure 13:
FIGS. 13 and 14 are diagrams for describing an operation of FIG. 12.
Figure 14:
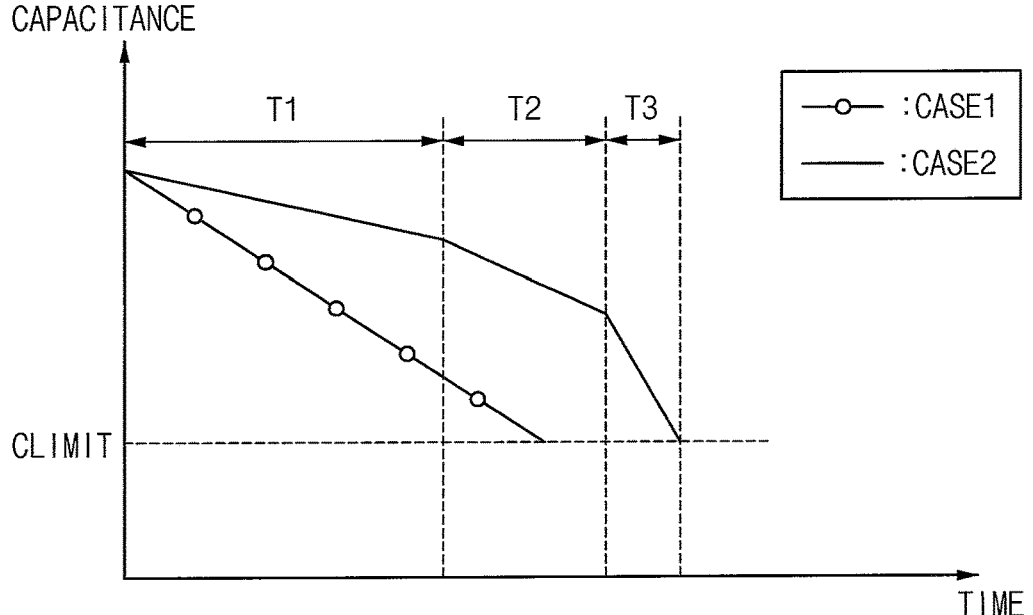

FIGS. 13 and 14 are diagrams for describing an operation of FIG. 12. The descriptions repeated with FIG. 10 will be omitted.

Referring to FIG. 13, an example of a second lookup table LUT2 that is used to perform the operation of FIG. 12 is illustrated. For example, the second lookup table LUT2 may be included in the lookup table 152 in the voltage controller 150 of FIG. 2.

The second lookup table LUT2 may represent a relationship between the voltage level of the charging voltage and the reference capacitance. For example, a voltage level V12 and a capacitance C12 corresponding thereto may be referred to as a state S12, a voltage level V22 and a capacitance C22 corresponding thereto may be referred to as a state S22, and a voltage level V32 and a capacitance C32 corresponding thereto may be referred to as a state S32.

The operation of FIG. 12 will be described with reference to the second lookup table LUT2 as follows.

In an initial operation time, the voltage level of the charging voltage VCG may be set to the voltage level V12, which is the lowest voltage level, and the secondary power source 110 may be charged based on the charging voltage VCG having the voltage level V12. The reference capacitance may be set to the capacitance C22 included in the state S22, which is a next state of the state S12 including voltage level V12.

After that, the present capacitance of the secondary power source 110 may be obtained. When the present capacitance is less than the capacitance C22, the voltage level of the charging voltage VCG may be set to the voltage level V22 that is higher than the voltage level V12 and is included in the state S22, the secondary power source 110 may be charged based on the charging voltage VCG having the voltage level V22, and the reference capacitance may be set to the capacitance C32 that is less than the capacitance C22 and is included in the next state S32. When the present capacitance is greater than or equal to the capacitance C22, the voltage level of the charging voltage VCG may be maintained to the voltage level V12 without changing to the voltage level V22, and the secondary power source 110 may be charged based on the charging voltage VCG having the voltage level V12.

Referring to FIG. 14, a change in the capacitance of the secondary power source over time is illustrated.

In FIG. 14, CASE1 represents a conventional method in which the voltage level of the charging voltage is fixed, and CASE2 represents example embodiments of the present disclosure in which the voltage level of the charging voltage is changed. In CASE2, T1 represents a time interval during which the voltage level of the charging voltage is set to the first voltage level, T2 represents a time interval during which the voltage level of the charging voltage is set to the second voltage level higher than the first voltage level, and T3 represents a time interval during which the voltage level of the charging voltage is set to the third voltage level higher than the second voltage level. It may be determined that the lifetime of the secondary power source has expired when the capacitance of the secondary power source decreases to a limit capacitance CLIMIT, and thus it can be seen that CASE2 has an increased lifetime of the secondary power source as compared with CASE1.

Figure 15:
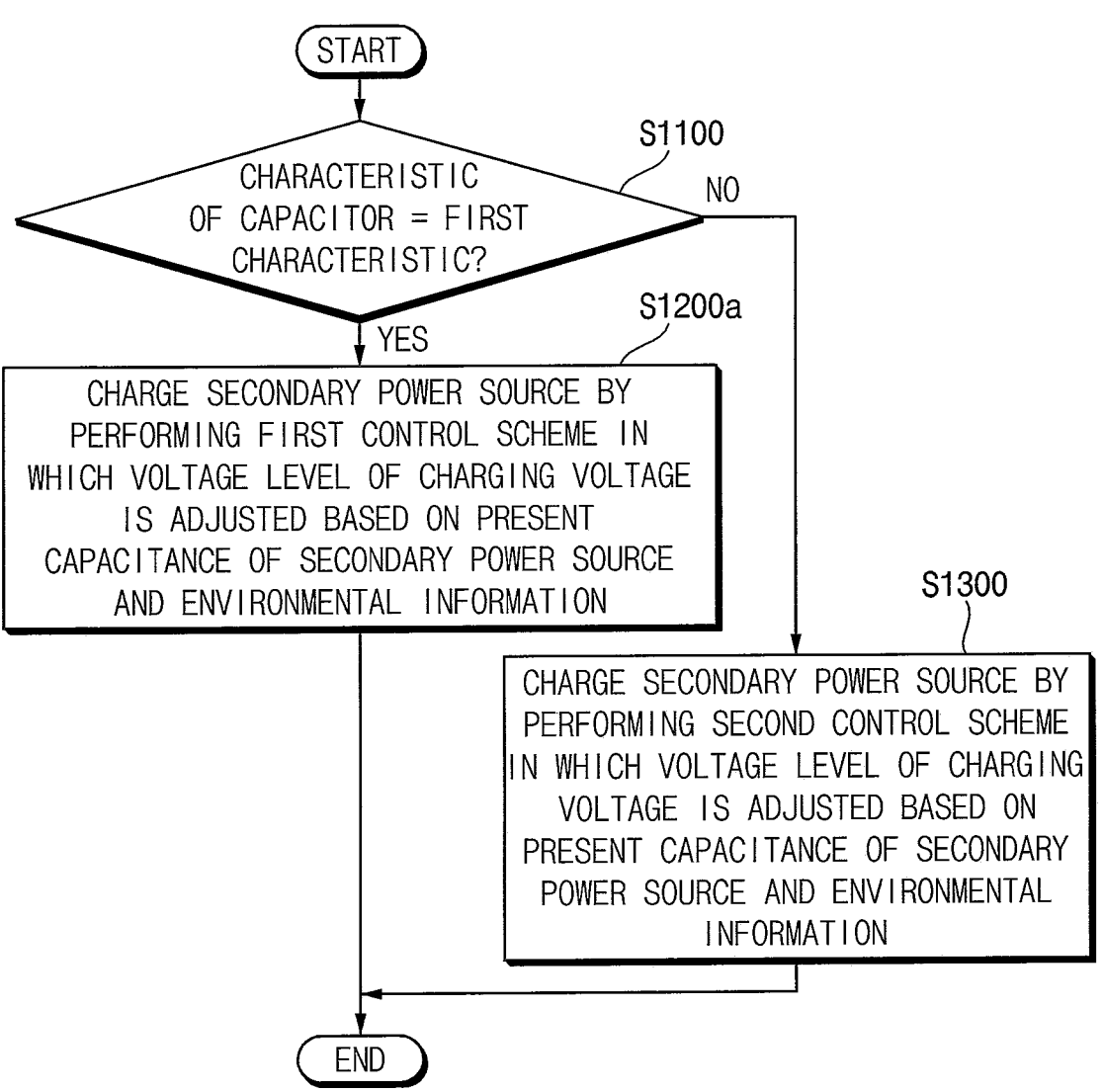
FIG. 15 is a flowchart illustrating a method of controlling a charging voltage according to example embodiments of the present disclosure.

FIG. 15 is a flowchart illustrating a method of controlling a charging voltage according to example embodiments of the present disclosure. The descriptions repeated with FIGS. 1 and 11 will be omitted.

Referring to FIG. 15, in a method of controlling a charging voltage according to example embodiments of the present disclosure, steps S1100 and S1300 may be substantially the same as steps S1100 and S1300 in FIG. 11, respectively.

When the at least one capacitor has the first characteristic (step S1100: YES), the secondary power source is charged by performing a first control scheme in which the voltage level of the charging voltage is adjusted based on the present capacitance of the secondary power source and the environmental information received from the environmental sensor (step S1200a). Unlike the first control scheme of step S1200 of FIG. 11, in the first control scheme of step S1200a, the environmental information received from the environmental sensor may be additionally used. For example, the environmental information may be additionally used when steps S1210 and S1250 in FIG. 12 are performed.

FIG. 16 is a diagram for describing an operation of FIG. 15. The descriptions repeated with FIGS. 10 and 13 will be omitted.

Referring to FIG. 16, an example of a third lookup table LUT3 that is used to perform step S1200a in FIG. 15 is illustrated. For example, the third lookup table LUT3 may be included in the lookup table 152 in the voltage controller 150 of FIG. 2.

The third lookup table LUT3 may represent a relationship between voltage levels V13, V23 and V33 of the charging voltage, reference capacitances C13, C23 and C33, and environmental information ER13, ER23 and ER33 as states S13, S23 and S33. For example, a voltage level V13, a capacitance C13 and environmental information ER13 corresponding thereto may be referred to as a state S13.

Figure 17:
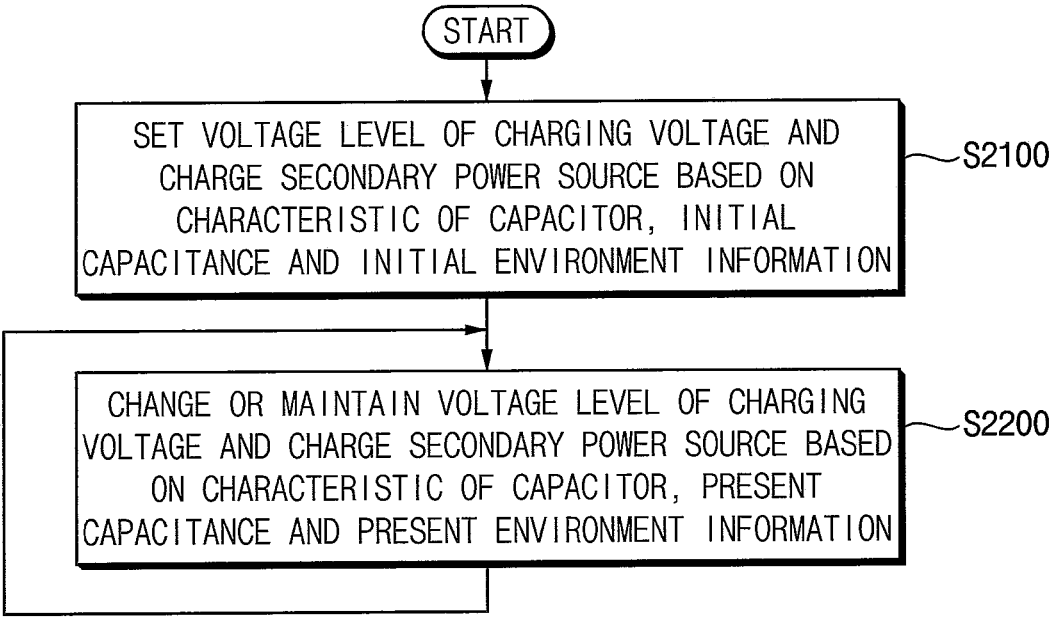
FIG. 17 is a flowchart illustrating a method of controlling a charging voltage according to example embodiments of the present disclosure.

FIG. 17 is a flowchart illustrating a method of controlling a charging voltage according to example embodiments of the present disclosure. The descriptions repeated with FIGS. 1, 11 and 15 will be omitted.

Referring to FIG. 17, in a method of controlling a charging voltage according to example embodiments of the present disclosure, based on the characteristic of the at least one capacitor included in the secondary power source, an initial capacitance of the secondary power source and the initial environmental information received from the environmental sensor, the voltage level of the charging voltage is set and the secondary power source is charged using the charging voltage (step S2100). Based on the characteristic of the at least one capacitor, the present capacitance of the secondary power source and the present environmental information received from the environmental sensor, the voltage level of the charging voltage is changed or maintained and the secondary power source is charged using the charging voltage (step S2200).

In some example embodiments of the present disclosure, step S1200 in FIG. 11 or step S1200a in FIG. 15 may correspond to the method of controlling the charging voltage of FIG. 17. For example, steps S1210, S1220 and S1230 in FIG. 12 may correspond to step S2100, and steps S1240, S1250, S1260, S1270, S1280 and S1290 in FIG. 12 may correspond to step S2200.

In some example embodiments of the present disclosure, the method of controlling the charging voltage of FIG. 1 or steps S1300 in FIGS. 11 and 15 may correspond to the method of controlling the charging voltage of FIG. 17. For example, steps S100 and S200 in FIG. 1 may correspond to steps S2100 and S2200, respectively.

FIGS. 18A, 188, 19A and 19B am diagrams for describing configurations and operations of an electronic device that performs a method of controlling a charging voltage according to example embodiments of the present disclosure.

Figure 18A:
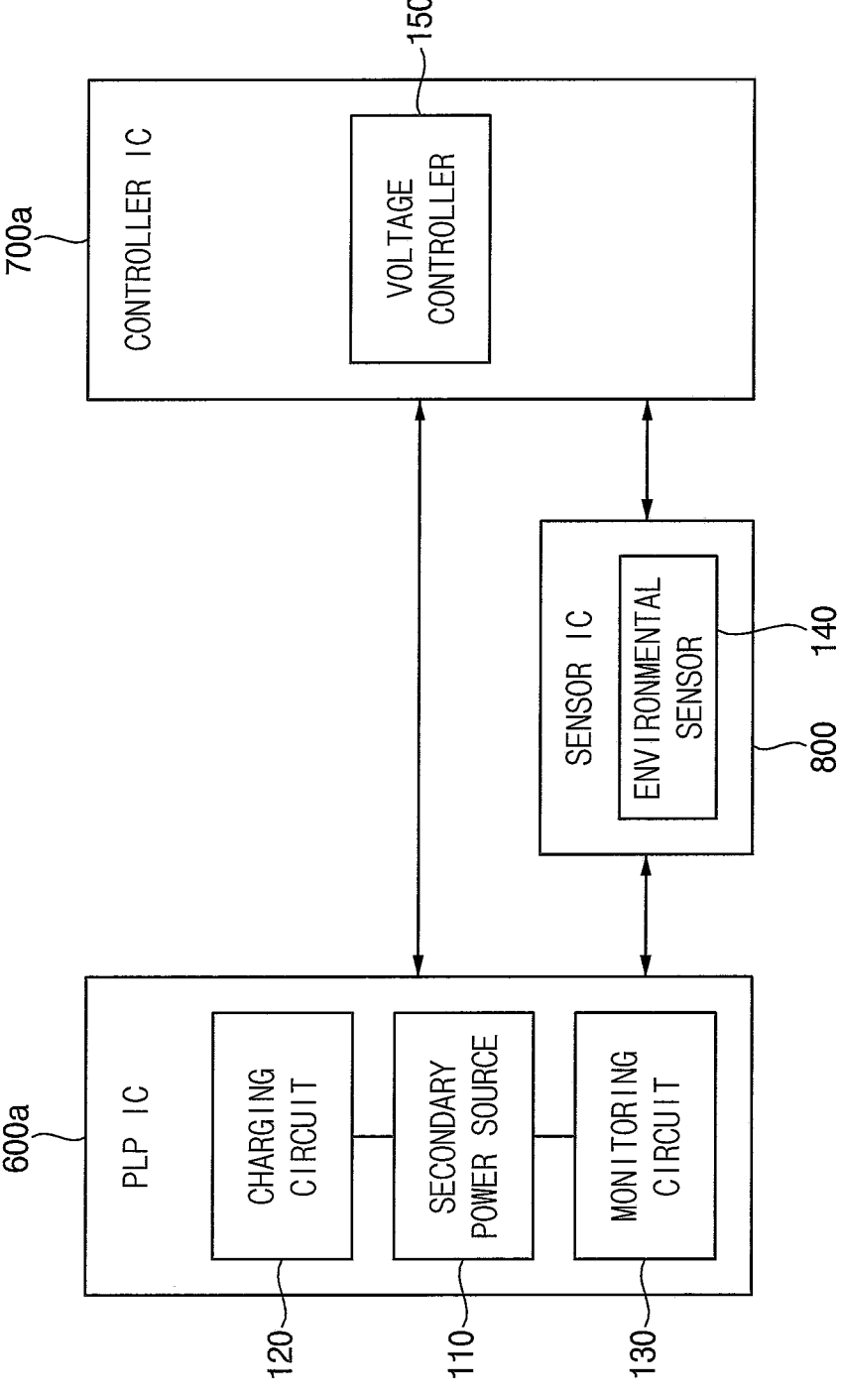

Referring to FIG. 18A, an electronic device may include a PLP IC 600a, a controller IC 700a and a sensor IC 800. The PLP IC 600a may include the secondary power source 110, the charging circuit 120 and the monitoring circuit 130. The controller IC 700a may include the voltage controller 150. The sensor IC 800 may include the environmental sensor 140. One IC represents an individual chip or package. FIG. 18A illustrates an example in which the charging circuit 120 and the monitoring circuit 130 are included in the same chip.

Figure 18B:
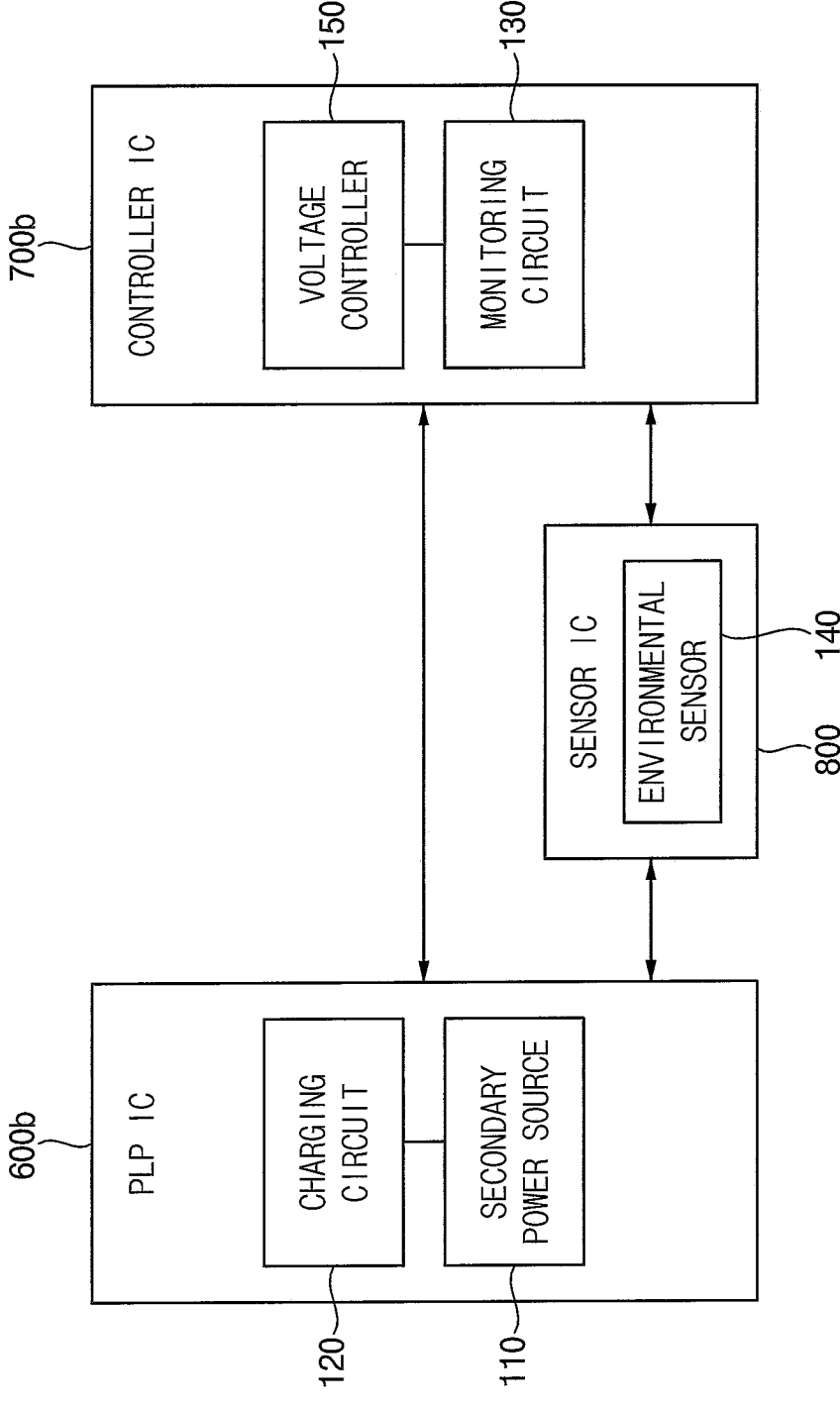

Referring to FIG. 18B, an electronic device may include a PLP IC 600b, a controller IC 700b and a sensor IC 800. The PLP IC 600b may include the secondary power source 110 and the charging circuit 120. The controller IC 700b may include the monitoring circuit 130 and the voltage controller 150. The sensor IC 800 may include the environmental sensor 140. FIG. 18B illustrates an example in which the charging circuit 120 and the monitoring circuit 130 are included in different chips.

Figure 19A:
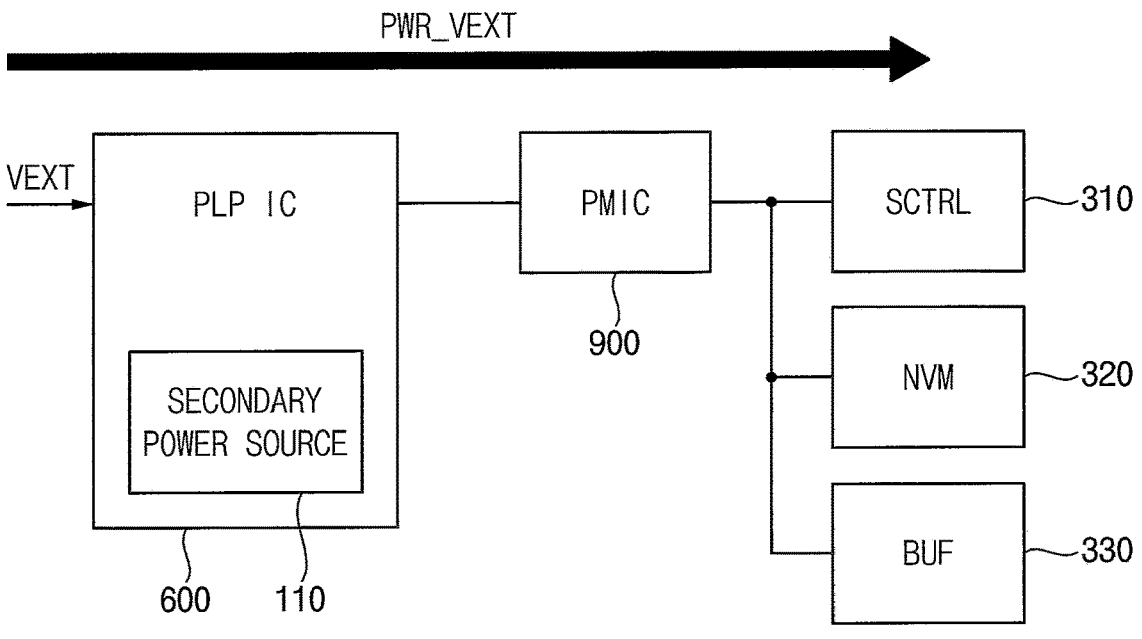

Referring to FIG. 19A, when the external power supply voltage VEXT is normally supplied to an electronic device, power PWR_VEXT that is generated based on the external power supply voltage VEXT may be supplied to the storage controller 310, the nonvolatile memory 320 and the buffer memory 330 through a PLP IC 600 and a power management integrated circuit (PMIC) 900. In other words, the main system 300 may operate based on the external power supply voltage VEXT.

Figure 19B:
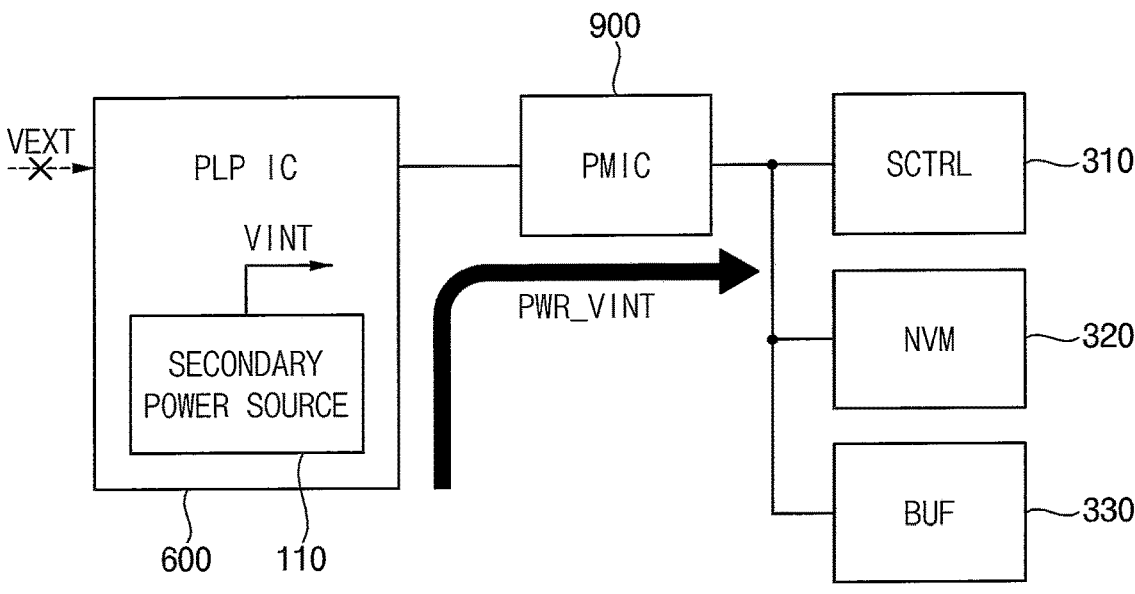

Referring to FIG. 19B, when the external power supply voltage VEXT is blocked or cut off (e.g., when a sudden power-off (SPO) event occurs), the secondary power source 110 may generate the internal power supply voltage VINT, and power PWR_VINT that is generated based on the internal power supply voltage VINT may be supplied to the storage controller 310, the nonvolatile memory 320 and the buffer memory 330 through the PLP IC 600 and the PMIC 900. In other words, the main system 300 may operate based on the internal power supply voltage VINT.

Figure 20:
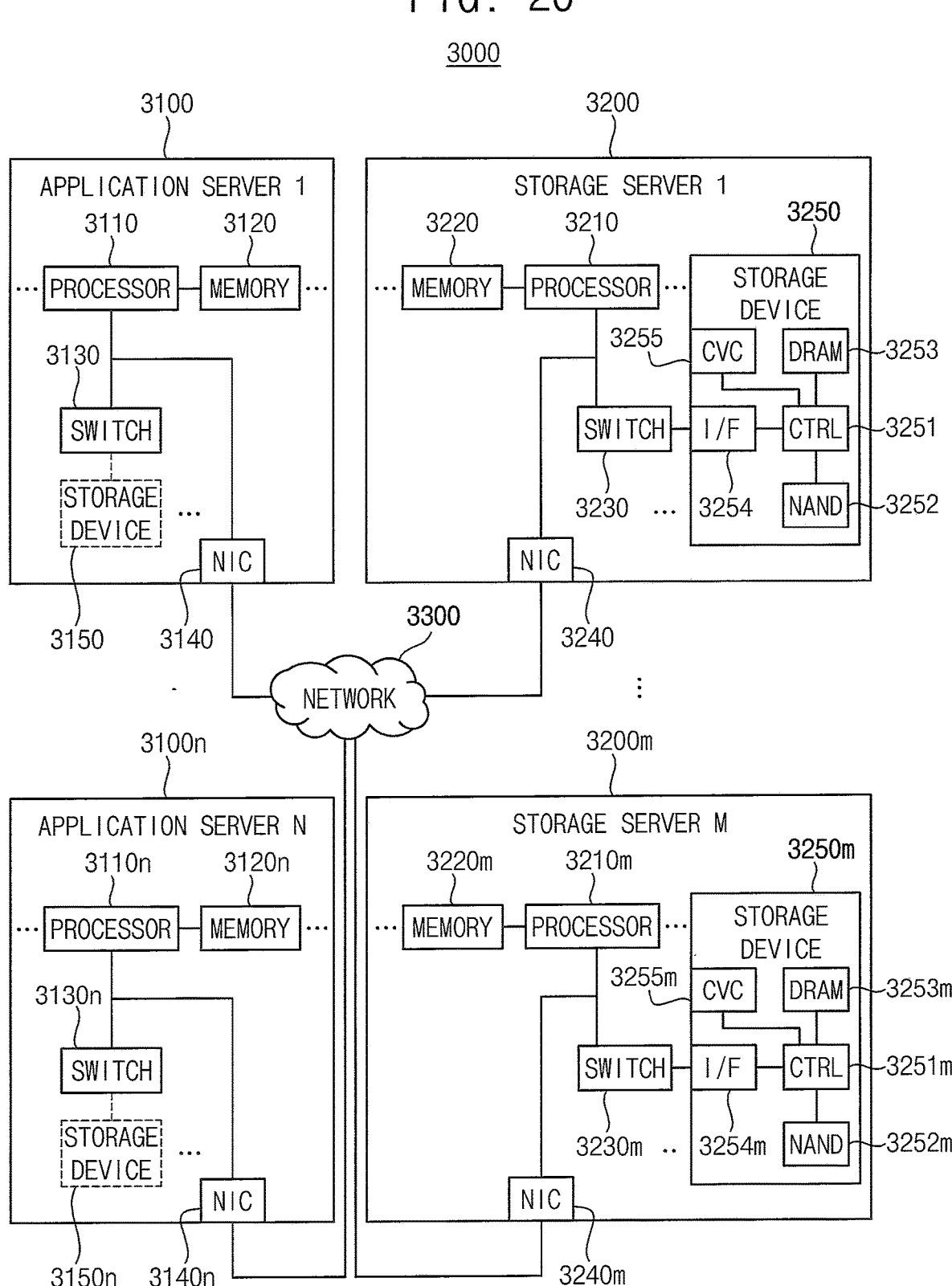
FIG. 20 is a block diagram illustrating a data center including a storage device according to example embodiments of the present disclosure.

FIG. 20 is a block diagram illustrating a data center including a storage device according to example embodiments of the present disclosure.

Referring to FIG. 20, a data center 3000 may be a facility that collects various types of data and provides various services, and may be referred to as a data storage center. The data center 3000 may be a system for operating search engines and databases, and may be a computing system used by companies such as banks or government agencies. The data center 3000 may include application servers 3100 to 3100n and storage servers 3200 to 3200m. The number of the application servers 3100 to 3100n and the number of the storage servers 3200 to 3200m may be variously selected according to example embodiments of the present disclosure, and the number of the application servers 3100 to 3100*n* and the number of the storage servers 3200 to 3200*m* may be different from each other.

The application server 3100 may include at least one processor 3110 and at least one memory 3120, and the storage server 3200 may include at least one processor 3210 and at least one memory 3220. An operation of the storage server 3200 will be described as an example. The processor 3210 may control overall operations of the storage server 3200, and may access the memory 3220 to execute instructions and/or data loaded in the memory 3220. The memory 3220 may include at least one of a double data rate (DDR) synchronous dynamic random access memory (SDRAM), a high bandwidth memory (HBM), a hybrid memory cube (HMC), a dual in-line memory module (DIMM), an Optane DIMM, a nonvolatile DIMM (NVDIMM), etc. The number of the processors 3210 and the number of the memories 3220 included in the storage server 3200 may be variously selected according to example embodiments of the present disclosure. In some example embodiments of the present disclosure, the processor 3210 and the memory 3220 may provide a processor-memory pair. In some example embodiments of the present disclosure, the number of the processors 3210 and the number of the memories 3220 may be different from each other. The processor 3210 may include a single core processor or a multiple core processor. The above description of the storage server 3200 may be similarly applied to the application server 3100. The application server 3100 may include at least one storage device 3150, and the storage server 3200 may include at least one storage device 3250. In some example embodiments of the present disclosure, the application server 3100 may not include the storage device 3150. The number of the storage devices 3250 included in the storage server 3200 may be variously selected according to example embodiments of the present disclosure.

The application servers 3100 to 3100*n* and the storage servers 3200 to 3200*m* may communicate with each other through a network 3300. The network 3300 may be implemented using a fiber channel (FC) or an Ethernet. The FC may be a medium used for a relatively high speed data transmission, and an optical switch that provides high performance and/or high availability may be used. The storage servers 3200 to 3200*m* may be provided as file storages, block storages or object storages according to an access scheme of the network 3300.

In some example embodiments of the present disclosure, the network 3300 may be a storage-only network or a network dedicated to a storage such as a storage area network (SAN). For example, the SAN may be an FC-SAN that uses an FC network and is implemented according to an FC protocol (FCP). As another example, the SAN may be an IP-SAN that uses a transmission control protocol/internet protocol (TCP/IP) network and is implemented according to an iSCSI (a SCSI over TCP/IP or an Internet SCSI) protocol. In other example embodiments of the present disclosure, the network 3300 may be a general network such as the TCP/IP network. For example, the network 3300 may be implemented according to at least one of protocols such as an FC over Ethernet (FCoE), a network attached storage (NAS), a nonvolatile memory express (NVMe) over Fabrics (NVMe-oF), etc.

Hereinafter, example embodiments of the present disclosure will be described based on the application server 3100 and the storage server 3200. The description of the application server 3100 may be applied to the other application server 3100*n*, and the description of the storage server 3200 may be applied to the other storage server 3200*m*.

The application server 3100 may store data requested to be stored by a user or a client into one of the storage servers 3200 to 3200*m* through the network 3300. In addition, the application server 3100 may obtain data requested to be read by the user or the client from one of the storage servers 3200 to 3200*m* through the network 3300. For example, the application server 3100 may be implemented as a web server or a database management system (DBMS).

The application server 3100 may access a memory 3120*n* or a storage device 3150*n* included in the other application server 3100*n* through the network 3300, and/or may access the memories 3220 to 3220*m* or the storage devices 3250 to 3250*m* included in the storage servers 3200 to 3200*m* through the network 3300. Thus, the application server 3100 may perform various operations on data stored in the application servers 3100 to 3100*n* and/or the storage servers 3200 to 3200*m*. For example, the application server 3100 may execute a command for moving or copying data between the application servers 3100 to 3100*n* and/or the storage servers 3200 to 3200*m*. The data may be transferred from the storage devices 3250 to 3250*m* of the storage servers 3200 to 3200*m* to the memories 3120 to 3120*n* of the application servers 3100 to 3100*n* directly or through the memories 3220 to 3220*m* of the storage servers 3200 to 3200*m*. For example, the data transferred through the network 3300 may be encrypted data for security or privacy.

In the storage server 3200, an interface 3254 may provide a physical connection between the processor 3210 and a controller 3251 and/or a physical connection between a network interface card (NIC) 3240 and the controller 3251. For example, the interface 3254 may be implemented based on a direct attached storage (DAS) scheme in which the storage device 3250 is directly connected with a dedicated cable. For example, the interface 3254 may be implemented based on at least one of various interface schemes such as an advanced technology attachment (ATA), a serial ATA (SATA) an external SATA (e-SATA), a small computer system interface (SCSI), a serial attached SCSI (SAS), a peripheral component interconnection (PCI), a PCI express (PCIe), an NVMe, an IEEE 1394, a universal serial bus (USB), a secure digital (SD) card interface, a multi-media card (MMC) interface, an embedded MMC (eMMC) interface, a universal flash storage (UFS) interface, an embedded UFS (eUFS) interface, a compact flash (CF) card interface, etc.

The storage server 3200 may further include a switch 3230 and the NIC 3240. The switch 3230 may selectively connect the processor 3210 with the storage device 3250 or may selectively connect the NIC 3240 with the storage device 3250 under a control of the processor 3210. Similarly, the application server 3100 may further include a switch 3130 and an NIC 3140.

In some example embodiments of the present disclosure, the NIC 3240 may include a network interface card, a network adapter, or the like. The NIC 3240 may be connected to the network 3300 through a wired interface, a wireless interface, a Bluetooth interface, an optical interface, or the like. The NIC 3240 may further include an internal memory, a digital signal processor (DSP), a host bus interface, or the like, and may be connected to the processor 3210 and/or the switch 3230 through the host bus interface. The host bus interface may be implemented as one of the above-described examples of the interface 3254. In some example embodiments of the present disclosure, the NIC 3240 may be integrated with at least one of the processor 3210, the switch 3230 and the storage device 3250.

In the storage servers 3200 to 3200*m* and/or the application servers 3100 to 3100*n*, the processor may transmit a command to the storage devices 3150 to 3150*n* and 3250 to 3250*m* or the memories 3120 to 3120*n* and 3220 to 3220*m* to program or read data. For example, the data may be error-corrected data by an error correction code (ECC) engine. For example, the data may be processed by a data bus inversion (DBI) or a data masking (DM), and may include a cyclic redundancy code (CRC) information. For example, the data may be encrypted data for security or privacy.

The storage devices 3150 to 3150*m* and 3250 to 3250*m* may transmit a control signal and command/address signals to NAND flash memory devices 3252 to 3252*m* (e.g., NAND flash memory devices) in response to a read command received from the processor (e.g., 3210). When data is read from the NAND flash memory devices 3252 to 3252*m*, a read enable (RE) signal may be input as a data output control signal and may serve to output data to a DQ bus. A data strobe signal (DQS) may be generated using the RE signal. The command and address signals may be latched in a page buffer based on a rising edge or a falling edge of a write enable (WE) signal.

The controller 3251 may control overall operations of the storage device 3250. In some example embodiments of the present disclosure, the controller 3251 may include a static random access memory (SRAM). The controller 3251 may write data into the NAND flash memory device 3252 in response to a write command, or may read data from the NAND flash memory device 3252 in response to a read command. For example, the write command and/or the read command may be provided from the processor 3210 in the storage server 3200, the processor 3210*m* in the other storage server 3200*m*, or the processors 3110 to 3110*n* in the application servers 3100 to 3100*n*. A DRAM 3253 may temporarily store (e.g., buffer) data to be written to the NAND flash memory device 3252 or data read from the NAND flash memory device 3252. Further, the DRAM 3253 may store meta data. The meta data may be data generated by the controller 3251 to manage user data or the NAND flash memory device 3252. The storage device 3250 may include a charging voltage controller (CVC) 3255, and may be implemented to set and change the voltage level of the charging voltage adaptively and/or in real time and to increase the lifetime and reliability of the secondary power source.

The charging voltage controller 3255 may include the secondary power source 110, the charging circuit 120, the monitoring circuit 130, the environmental sensor 140 and the voltage controller 150 in FIG. 2, and may perform the method of controlling the charging voltage according to example embodiments of the present disclosure.

The inventive concept may be applied to various electronic devices and systems that include the storage devices and the storage systems. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

While the present disclosure has been shown and described with reference to various example embodiments, it will be apparent to those of ordinary skill in the art that many modifications may be made to the disclosed example embodiments without departing from the scope of the present disclosure as set forth in the appended claims.

What is claimed is:

1. A method of controlling a charging voltage, the method comprising:

determining, a characteristic of at least one capacitor included in a secondary power source;

in response to the at least one capacitor having a predetermined characteristic, charging the secondary power source with a charging voltage generated by performing a predetermined control scheme in which a voltage level of the charging voltage is adjusted based on a present capacitance of the secondary power source and environmental information value received from an environmental sensor, wherein charging the secondary power source by performing the predetermined control scheme includes:

receiving a first environmental information value from the environmental sensor;

setting the voltage level of the charging voltage to a first voltage level in response to the first environmental information value;

charging the secondary power source including at least one capacitor with the charging voltage having the first voltage level;

receiving a second environmental information value from the environmental sensor;

in response to the second environmental information value being different than the first environmental information value, selectively changing the voltage level of the charging voltage; and charging the secondary power source with the charging voltage having the selectively changed voltage level, wherein selectively changing the voltage level of the charging voltage includes determining whether the secondary power source satisfies a predetermined energy condition corresponding to the second environmental information value by:

obtaining the present capacitance of the secondary power source; and obtaining an expected change energy value based on the present capacitance of the secondary power source and a second voltage level different from the first voltage level;

in response to the second environmental information value being different than the first environmental information value, and in response to the secondary power source satisfying the predetermined energy condition, changing the voltage level of the charging voltage to the second voltage level; and in response to the second environmental information value being different than the first environmental information value, and in response to the secondary power source not satisfying the predetermined energy condition, maintaining the voltage level of the charging voltage at the first voltage level, wherein the second voltage level corresponds to the second environmental information value, wherein the present capacitance of the secondary power source is determined by a monitoring circuit, and wherein charging the secondary power source with the charging voltage having the selectively changed voltage level includes:

in response to the second environmental information value being different than the first environmental information value, and in response to the secondary power source satisfying the predetermined energy condition, charging the secondary power source with the charging voltage having the second voltage level; and in response to the second environmental information value being different than the first environmental information value, and in response to the secondary power source not satisfying the predetermined energy condition, charging the secondary power source with the charging voltage having the first voltage level.

2. The method of claim 1, wherein the determining whether the secondary power source satisfies the predetermined energy condition includes:

comparing a predetermined energy value with the expected change energy value.

3. The method of claim 2, wherein:

in response to the predetermined energy value being less than the expected change energy value, it is determined that the predetermined energy condition is satisfied, and in response to the predetermined energy value being greater than or equal to the expected change energy value, it is determined that the predetermined energy condition is unsatisfied.

4. The method of claim 1, wherein the selectively changing the voltage level of the charging voltage further includes:

after the voltage level of the charging voltage is changed to the second voltage level, storing the second environmental information value.

5. The method of claim 1, wherein the environmental sensor includes a temperature sensor, a humidity sensor, a pressure sensor, a motion sensor, a temporal sensor, a spatial sensor, an illumination sensor, an acceleration sensor, a vibration sensor, a mechanical stress sensor or a shock sensor.

6. The method of claim 1, further comprising:

after the secondary power source is charged based on the charging voltage having the first voltage level, storing the first environmental information value.

7. The method of claim 1, wherein operations of receiving the second environmental information value, selectively changing the voltage level of the charging voltage, and charging the secondary power source with the charging voltage having the selectively changed voltage level are periodically performed.

8. The method of claim 1, wherein operations of receiving the second environmental information value, selectively changing the voltage level of the charging voltage, and charging the secondary power source with the charging voltage having the selectively changed voltage level are performed in response to an external command.

9. The method of claim 1, further comprising:

in response to the second environmental information value being equal to the first environmental information value, maintaining the voltage level of the charging voltage; and charging the secondary power source with the charging voltage having the maintained voltage level.

10. A method of controlling a charging voltage, the method comprising:

determining, a characteristic of at least one capacitor included in a secondary power source;

in response to the at least one capacitor having a first characteristic, charging the secondary power source with the charging voltage generated by performing a first control scheme in which a voltage level of the charging voltage is adjusted based on a present capacitance of the secondary power source; and in response to the at least one capacitor having a second characteristic, charging the secondary power source with the charging voltage generated by performing a second control scheme in which the voltage level of the charging voltage is adjusted based on the present capacitance of the secondary power source and environmental information value received from an environmental sensor, wherein charging the secondary power source by performing the second control scheme includes:

receiving a first environmental information value from the environmental sensor;

setting the voltage level of the charging voltage to a first voltage level in response to the first environmental information value;

charging the secondary power source with the charging voltage having the first voltage level;

receiving a second environmental information value from the environmental sensor;

in response to the second environmental information value being different than the first environmental information value, selectively changing the voltage level of the charging voltage; and charging the secondary power source with the charging voltage having the selectively changed voltage level, wherein selectively changing the voltage level of the charging voltage includes:

determining whether the secondary power source satisfies a predetermined energy condition corresponding to the second environmental information value by:

obtaining the present capacitance of the secondary power source; and obtaining an expected change energy value based on the present capacitance of the secondary power source and a second voltage level different from the first voltage level;

in response to the second environmental information value being different than the first environmental information value, and in response to the secondary power source satisfying the predetermined energy condition, changing the voltage level of the charging voltage to the second voltage level; and in response to the second environmental information value being different than the first environmental information value, and in response to the secondary power source not satisfying the predetermined energy condition, maintaining the voltage level of the charging voltage at the first voltage level, wherein the second voltage level corresponds to the second environmental information value, wherein the present capacitance of the secondary power source is determined by a monitoring circuit, and wherein charging the secondary power source with the charging voltage having the selectively changed voltage level includes:

in response to the second environmental information value being different than the first environmental information value, and in response to the secondary power source satisfying the predetermined energy condition, charging the secondary power source with the charging voltage having the second voltage level; and in response to the second environmental information value being different than the first environmental information value, and in response to the secondary power source not satisfying the predetermined energy condition, charging the secondary power source with the charging voltage having the first voltage level.

11. The method of claim 10, wherein:

the first characteristic represents that a remaining lifetime of the at least one capacitor decreases rapidly as the voltage level of the charging voltage increases, and the second characteristic represents that the remaining lifetime of the at least one capacitor decreases slowly as the voltage level of the charging voltage increases, or the remaining lifetime of the at least one capacitor is irrelevant to the voltage level of the charging voltage.

12. The method of claim 10, wherein the charging the secondary power source by performing the first control scheme includes:

setting the voltage level of the charging voltage to a third voltage level;

charging the secondary power source based on the charging voltage having the third voltage level;

obtaining the present capacitance of the secondary power source by performing a monitoring operation;

in response to the present capacitance of the secondary power source being less than a first reference capacitance, changing the voltage level of the charging voltage to a second fourth voltage level different from the third voltage level; and charging the secondary power source based on the charging voltage having the second fourth voltage level.

13. The method of claim 12, wherein the fourth voltage level is higher than the third voltage level.

14. The method of claim 12, wherein charging the secondary power source by performing the first control scheme further includes:

in response to the present capacitance of the secondary power source being greater than or equal to the first reference capacitance, maintaining the voltage level of the charging voltage at the third voltage level.

15. The method of claim 12, wherein the charging of the secondary power source by performing the first control scheme further includes:

after the secondary power source is charged based on the charging voltage having the fourth voltage level, obtaining the present capacitance of the secondary power source by performing the monitoring operation;

in response to the present capacitance of the secondary power source being less than a second reference capacitance, changing the voltage level of the charging voltage to a fifth voltage level, the second reference capacitance being different from the first reference capacitance, the fifth voltage level being different from the third voltage level and the fourth voltage level; and charging the secondary power source based on the charging voltage having the fifth voltage level.

16. The method of claim 15, wherein:

the fifth voltage level is higher than the third voltage level and the fourth voltage level, and the second reference capacitance is less than the first reference capacitance.

17. A method of controlling a charging voltage that is used to charge a secondary power source including at least one capacitor, the method comprising:

determining whether the at least one capacitor has a first characteristic or a second characteristic different from the first characteristic;

in response to the at least one capacitor having the first characteristic, charging the secondary power source by performing a first control scheme in which a voltage level of the charging voltage is adjusted based on a present capacitance of the secondary power source; and in response to the at least one capacitor having the second characteristic, charging the secondary power source by performing a second control scheme in which the voltage level of the charging voltage is adjusted based on the present capacitance of the secondary power source and environmental information value received from an environmental sensor, wherein the first characteristic represents that a remaining lifetime of the at least one capacitor decreases rapidly as the voltage level of the charging voltage increases, wherein the second characteristic represents that the remaining lifetime of the at least one capacitor decreases slowly as the voltage level of the charging voltage increases, or the remaining lifetime of the at least one capacitor is irrelevant to the voltage level of the charging voltage, wherein charging the secondary power source by performing the first control scheme includes:

setting the voltage level of the charging voltage to a first voltage level;

charging the secondary power source based on the charging voltage having the first voltage level;

obtaining the present capacitance of the secondary power source;

in response to the present capacitance of the secondary power source being less than a first reference capacitance, changing the voltage level of the charging voltage to a second voltage level higher than the first voltage level; and charging the secondary power source based on the charging voltage having the second voltage level, and wherein charging the secondary power source by performing the second control scheme includes:

receiving initial environmental information value from the environmental sensor;

setting the voltage level of the charging voltage to a third voltage level based on the initial environmental information value;

charging the secondary power source based on the charging voltage having the third voltage level;

storing the initial environmental information value as previous environmental information value;

receiving present environmental information value from the environmental sensor;

in response to the present environmental information value being different than the previous environmental information value, selectively changing the voltage level of the charging voltage;

charging the secondary power source based on the charging voltage having the selectively changed voltage level; and storing the present environmental information value as new previous environmental information value, wherein selectively changing the voltage level of the charging voltage includes:

determining whether the secondary power source satisfies a predetermined energy condition corresponding to the present environmental information value by:

obtaining the present capacitance of the secondary power source; and obtaining an expected change energy value based on the present capacitance of the secondary power source and a fourth voltage level different from the third voltage level;

in response to the present environmental information value being different than the previous environmental information value, and in response to the secondary power source satisfying the predetermined energy condition, changing the voltage level of the charging voltage to the fourth voltage level; and in response to the present environmental information value being different than the previous environmental information value, and in response to the secondary power source not satisfying the predetermined energy condition, maintaining the voltage level of the charging voltage at the third voltage level, wherein the fourth voltage level corresponds to the present environmental information value, wherein the present capacitance of the secondary power source is determined by a monitoring circuit, and wherein charging the secondary power source with the charging voltage having the selectively changed voltage level includes:

in response to the present environmental information value being different than the previous environmental information value, and in response to the secondary power source satisfying the predetermined energy condition, charging the secondary power source with the charging voltage having the fourth voltage level; and in response to the present environmental information value being different than the previous environmental information value, and in response to the secondary power source not satisfying the predetermined energy condition, charging the secondary power source with the charging voltage having the third voltage level.

* * * * *